(12) United States Patent
Hou et al.

(10) Patent No.: US 12,155,368 B2
(45) Date of Patent: Nov. 26, 2024

(54) SUPPORT STRUCTURE FOR BULK ACOUSTIC WAVE RESONATOR

(71) Applicant: Global Communication Semiconductors, LLC., Torrance, CA (US)

(72) Inventors: Liping D. Hou, Torrance, CA (US); Kun-Mao Pan, Harbor City, CA (US); Shing-Kuo Wang, Torrance, CA (US); Yuefei Yang, Torrance, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 851 days.

(21) Appl. No.: 17/240,943

(22) Filed: Apr. 26, 2021

(65) Prior Publication Data

US 2021/0250012 A1 Aug. 12, 2021

Related U.S. Application Data

(63) Continuation-in-part of application No. 16/455,627, filed on Jun. 27, 2019, now Pat. No. 11,764,750.
(Continued)

(51) Int. Cl.
*H03H 9/08* (2006.01)
*H03H 3/02* (2006.01)
*H03H 9/17* (2006.01)

(52) U.S. Cl.
CPC ............. *H03H 9/08* (2013.01); *H03H 3/02* (2013.01); *H03H 9/173* (2013.01); *H03H 2003/021* (2013.01)

(58) Field of Classification Search
CPC .................................. H03H 9/02; H03H 9/17
See application file for complete search history.

(56) References Cited

U.S. PATENT DOCUMENTS

| 4,320,365 A | 3/1982 | Black et al. |
| 4,456,850 A | 6/1984 | Inoue et al. |

(Continued)

FOREIGN PATENT DOCUMENTS

| JP | 2016140053 A | 8/2016 |
| TW | 200610266 A | 3/2006 |
| WO | WO2020132997 A1 | 7/2020 |

OTHER PUBLICATIONS

Global Communication Semiconductors, Inc., CN Office Action, Chinese Application No. 201711127532.1, Nov. 22, 2022, 23 pgs.
(Continued)

*Primary Examiner* — Andrea Lindgren Baltzell
*Assistant Examiner* — Alan Wong
(74) *Attorney, Agent, or Firm* — Morgan, Lewis & Bockius LLP

(57) ABSTRACT

Devices and processes for preparing devices are described for a bulk acoustic wave resonator. A stack formed over a substrate includes a piezoelectric film element, a first (e.g., bottom) electrode coupled to a first side of the piezoelectric film element, and a second (e.g., top) electrode that is coupled to a second side of the piezoelectric film element. A cavity is positioned between the stack and the substrate. The resonator includes one or more planarizing layers, including a first planarizing layer around the cavity, wherein a first portion of the first electrode is adjacent the cavity and a second portion of the first electrode is adjacent the first planarizing layer. The resonator optionally includes an air reflector around the perimeter of the piezoelectric film element. The stack is configured to resonate in response to an electrical signal applied between the first electrode and the second electrode.

10 Claims, 30 Drawing Sheets

Bulk Acoustic Resonator 960

Related U.S. Application Data

(60) Provisional application No. 62/701,382, filed on Jul. 20, 2018.

(56) References Cited

U.S. PATENT DOCUMENTS

| | | | |
|---|---|---|---|
| 5,448,014 A | 9/1995 | Kong et al. | |
| 5,578,974 A | 11/1996 | Yang et al. | |
| 5,587,620 A | 12/1996 | Ruby et al. | |
| 5,873,153 A | 2/1999 | Ruby et al. | |
| 5,894,647 A | 4/1999 | Lakin | |
| 6,060,818 A | 5/2000 | Ruby et al. | |
| 6,150,703 A | 11/2000 | Cushman et al. | |
| 6,262,637 B1 | 7/2001 | Bradley et al. | |
| 6,278,342 B1 | 8/2001 | Ella | |
| 6,424,237 B1 | 7/2002 | Ruby et al. | |
| 6,693,500 B2 | 2/2004 | Yang et al. | |
| 6,828,713 B2 | 12/2004 | Bradley et al. | |
| 6,842,088 B2 | 1/2005 | Yamada et al. | |
| 7,327,073 B2 | 2/2008 | Shearer et al. | |
| 7,345,410 B2 | 3/2008 | Grannen et al. | |
| 7,408,428 B2 | 8/2008 | Larson | |
| 7,522,018 B2 | 4/2009 | Milsom et al. | |
| 7,737,806 B2 | 6/2010 | Taniguchi et al. | |
| 7,795,781 B2 * | 9/2010 | Barber | H03H 9/172 310/320 |
| 8,330,325 B1 * | 12/2012 | Burak | H03H 9/173 333/187 |
| 8,350,445 B1 * | 1/2013 | Shirakawa | H03H 9/173 310/365 |
| 8,896,395 B2 | 11/2014 | Burak et al. | |
| 9,197,185 B2 | 11/2015 | Zou et al. | |
| 9,246,079 B2 | 1/2016 | Umeda et al. | |
| 9,246,473 B2 * | 1/2016 | Burak | H03H 9/02118 |
| 9,374,059 B1 | 6/2016 | Hurwitz et al. | |
| 9,401,692 B2 * | 7/2016 | Burak | H03H 9/02157 |
| 9,479,139 B2 | 10/2016 | Ruby et al. | |
| 9,608,589 B2 * | 3/2017 | Grannen | H03H 9/173 |
| 9,634,643 B2 | 4/2017 | Shin et al. | |
| 9,842,980 B2 | 12/2017 | Park et al. | |
| 10,079,334 B2 | 9/2018 | Moulard et al. | |
| 10,298,197 B2 * | 5/2019 | Lee | H03H 9/564 |
| 10,601,391 B2 | 3/2020 | Stokes et al. | |
| 11,424,729 B2 * | 8/2022 | Lee | H03H 9/174 |
| 11,736,088 B2 | 8/2023 | Stokes et al. | |
| 11,764,750 B2 * | 9/2023 | Hou | H03H 3/02 310/341 |
| 11,817,839 B2 * | 11/2023 | Wang | H03H 9/176 |
| 11,909,373 B2 | 2/2024 | Wang et al. | |
| 2005/0012568 A1 | 1/2005 | Aigner | |
| 2005/0179508 A1 | 8/2005 | Sato | |
| 2006/0145785 A1 | 7/2006 | Ishii et al. | |
| 2007/0001544 A1 | 1/2007 | Geefay | |
| 2008/0111452 A1 | 5/2008 | Koizumi et al. | |
| 2008/0292127 A1 | 11/2008 | Ruile et al. | |
| 2010/0019866 A1 | 1/2010 | Hara et al. | |
| 2010/0148637 A1 | 6/2010 | Satou | |
| 2011/0080233 A1 | 4/2011 | Petit et al. | |
| 2011/0227671 A1 | 9/2011 | Zhang | |
| 2011/0266917 A1 | 11/2011 | Metzger et al. | |
| 2011/0298564 A1 | 12/2011 | Iwashita et al. | |
| 2012/0056694 A1 | 3/2012 | Pang et al. | |
| 2012/0205754 A1 | 8/2012 | Iwamoto | |
| 2013/0049545 A1 | 2/2013 | Zou et al. | |
| 2013/0057115 A1 | 3/2013 | Saito et al. | |
| 2013/0140959 A1 | 6/2013 | Shin et al. | |
| 2014/0117815 A1 | 5/2014 | Bi et al. | |
| 2014/0125203 A1 | 5/2014 | Choy et al. | |
| 2014/0354109 A1 | 12/2014 | Grannen et al. | |
| 2016/0065171 A1 | 3/2016 | Ruby et al. | |
| 2016/0294354 A1 | 10/2016 | Saijo et al. | |
| 2016/0352309 A1 | 12/2016 | Xu et al. | |
| 2017/0077385 A1 | 3/2017 | Stokes et al. | |
| 2017/0149405 A1 | 5/2017 | Kishimoto | |
| 2017/0338399 A1 | 11/2017 | Kim et al. | |
| 2018/0138885 A1 | 5/2018 | Stokes et al. | |
| 2019/0149129 A1 | 5/2019 | Ueda | |
| 2019/0356293 A1 | 11/2019 | Kim et al. | |
| 2019/0379344 A1 | 12/2019 | Wang et al. | |
| 2020/0028482 A1 | 1/2020 | Hou et al. | |
| 2020/0220520 A1 | 7/2020 | Stokes et al. | |
| 2020/0235718 A1 | 7/2020 | Modarres-Zadeh et al. | |
| 2020/0313648 A1 | 10/2020 | Wang et al. | |
| 2020/0389150 A1 | 12/2020 | Wang et al. | |
| 2021/0006220 A1 | 1/2021 | Schiek et al. | |
| 2021/0099156 A1 | 4/2021 | Kirkendall et al. | |
| 2021/0111693 A1 | 4/2021 | Hou et al. | |
| 2021/0111699 A1 | 4/2021 | Hou et al. | |
| 2021/0111701 A1 | 4/2021 | Hou et al. | |
| 2021/0111702 A1 | 4/2021 | Wang et al. | |
| 2021/0143792 A1 | 5/2021 | Pollard | |
| 2022/0416149 A1 | 12/2022 | Hou et al. | |

OTHER PUBLICATIONS

Global Communication Semiconductors, Inc., U.S. Non-Final Office Action, U.S. Appl. No. 17/071,831, Jul. 17, 2023, 12 pgs.

Global Communication Semiconductors, Inc., U.S. Non-Final Office Action, U.S. Appl. No. 16/455,627, Dec. 20, 2022, 8 pgs.

Global Communication Semiconductors, Inc., Restriction Election, U.S. Appl. No. 17/071,836, Jun. 21, 2023, 7 pgs.

Global Communication Semiconductors, Inc., Restriction Election, U.S. Appl. No. 17/071,810, Aug. 9, 2023, 7 pgs.

Global Communication Semiconductors, Inc., U.S. Non-Final Office Action, U.S. Appl. No. 16/820,625, Nov. 14, 2022, 10 pgs.

Global Communication Semiconductors, Inc., U.S. Non-Final Office Action, U.S. Appl. No. 17/071,836, Aug. 1, 2023, 13 pgs.

Global Communication Semiconductors, Inc., U.S. Final Office Action, U.S. Appl. No. 17/002,498, Jun. 7, 2023, 16 pgs.

Global Communication Semiconductors, Inc., U.S. Final Office Action, U.S. Appl. No. 17/071,836, Feb. 28, 2024, 17 pgs.

Global Communication Semiconductors, Inc., U.S. Notice of Allowance, U.S. Appl. No. 16/820,625, Apr. 5, 2023, 9 pgs.

Global Communication Semiconductors, Inc., U.S. Notice of Allowance, U.S. Appl. No. 17/071,831, Jan. 5, 2024, 8 pgs.

Global Communication Semiconductors, Inc., U.S. Notice of Allowance, U.S. Appl. No. 17/071,810, Jan. 23, 2024, 14 pgs.

Global Communication Semiconductors, Inc., Restriction Election, U.S. Appl. No. 16/455,627, Aug. 19, 2022, 7 pgs.

Working principles and Applications of SAW/FBAR Devices, Taiyo Yuden Navigator, Oct. 2017, 6 pqs.

"Yoo et al., Spurious Resonances and Modelling of Composite Resonators," "Department of Physics, The Catholic University of America, Washington, D.C., © 1983 IEEE, 3 pgs."

"Yoo et al., Spurious Resonances in Bulk Acoustic Wave Resonators," "Department of Physics, The Catholic University of America, Washington, D.C., © 1982 IEEE, 1982 Ultrasonics Symposium, 4 pgs."

Stokes, Notice of Allowance, U.S. Appl. No. 15/789,109, Nov. 14, 2019, 11pgs.

Wang, Office Action, U.S. Appl. No. 16/368,754, Jul. 13, 2022, 7pgs.

Wang, Office Action, U.S. Appl. No. 17/002,498, Jul. 12, 2022, 12pgs.

Global Communications Semiconductors, Inc., U.S. Non-Final Office Action, U.S. Appl. No. 17/071,836, Aug. 12, 2024, 20 pgs.

* cited by examiner

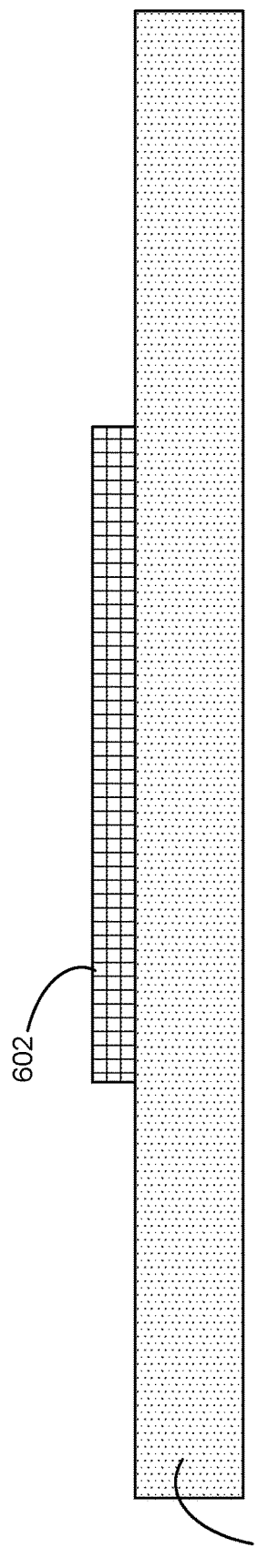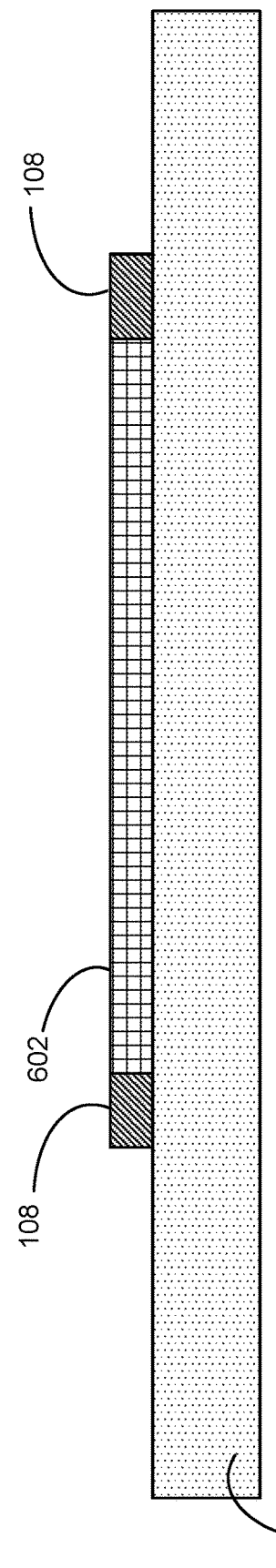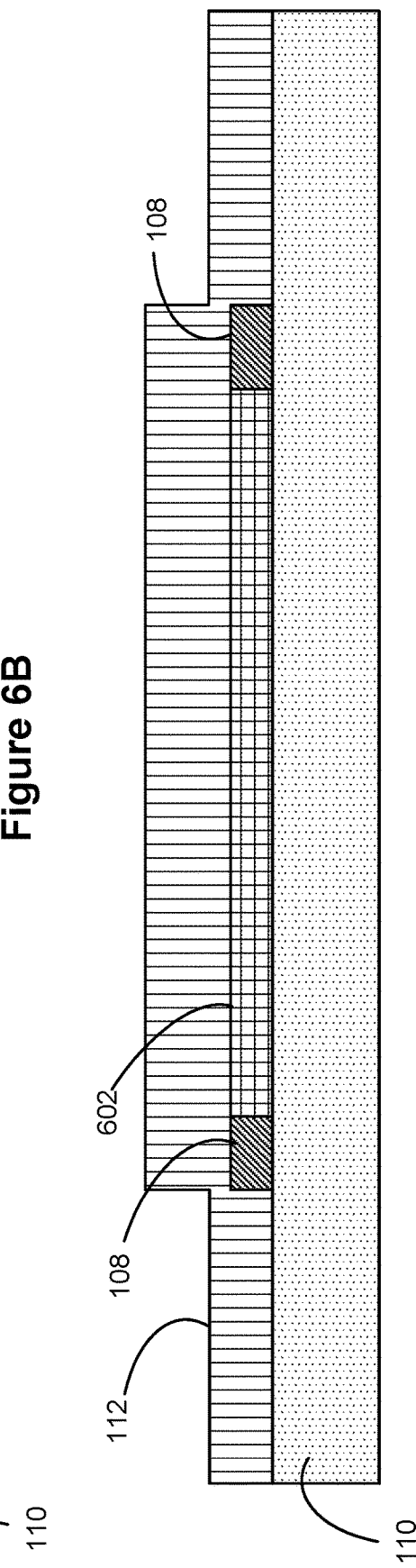

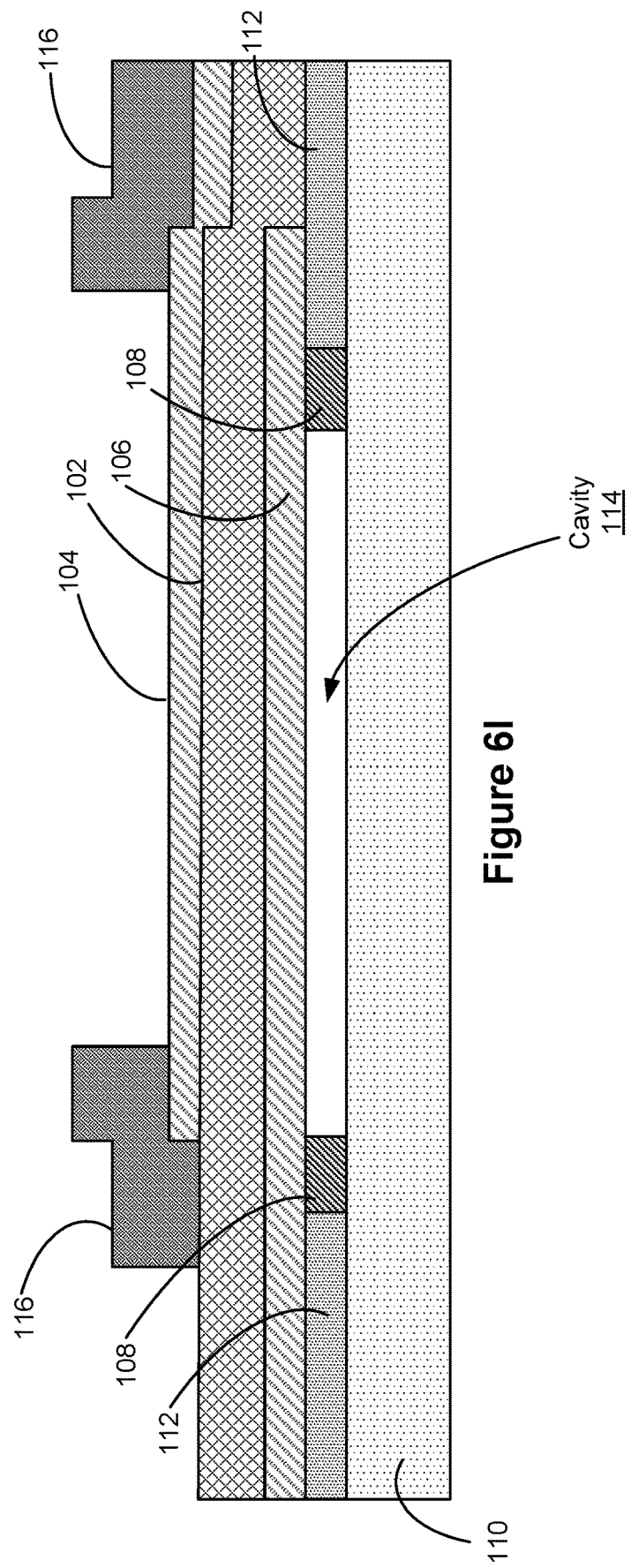

700

(A)

Forming, over the piezoelectric film element, a second electrode (top electrode) —1014

Forming, over the second electrode, a heat dissipation frame —716

The heat dissipation frame includes a medial opening that passes through the heat dissipation frame —718

The heat dissipation frame includes at least one material selected from the group consisting of aluminum, copper, silver, gold, and diamond —720

Remove at least a portion of the sacrificial material to form a cavity —722

The cavity is bounded by the first electrode, the substrate, and the cavity frame —724

The cavity frame is configured to dissipate heat generated by the stack —726

The cavity frame includes at least one material selected from the group consisting of aluminum, copper, silver, gold, and diamond —728

Figure 7B

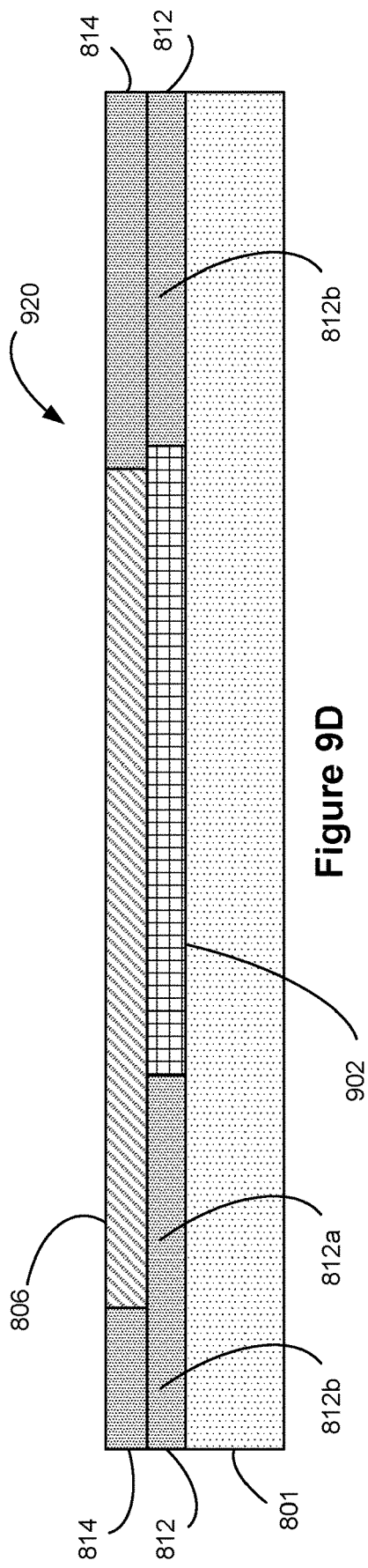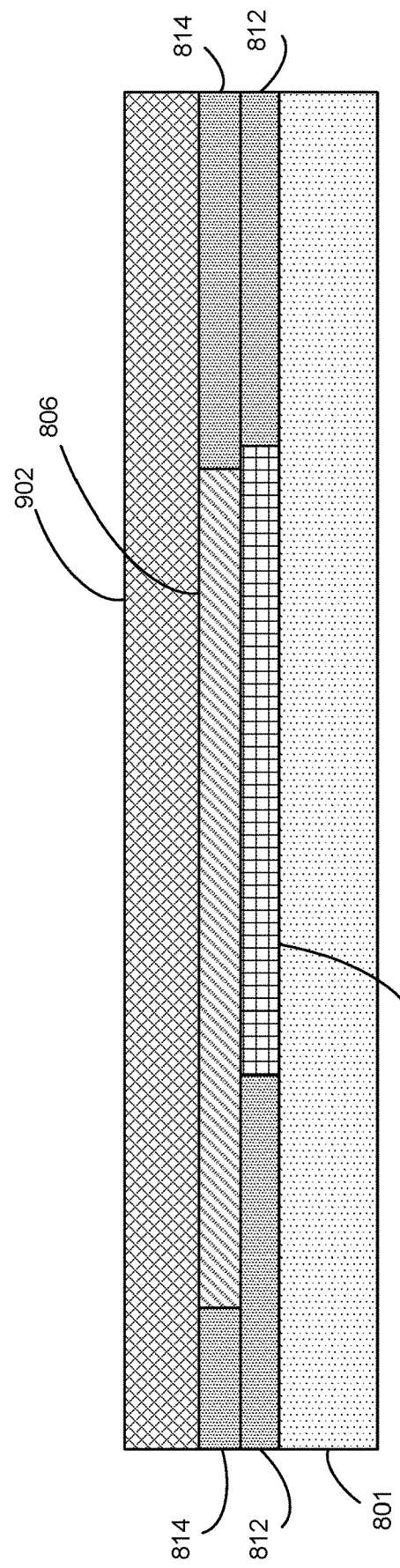

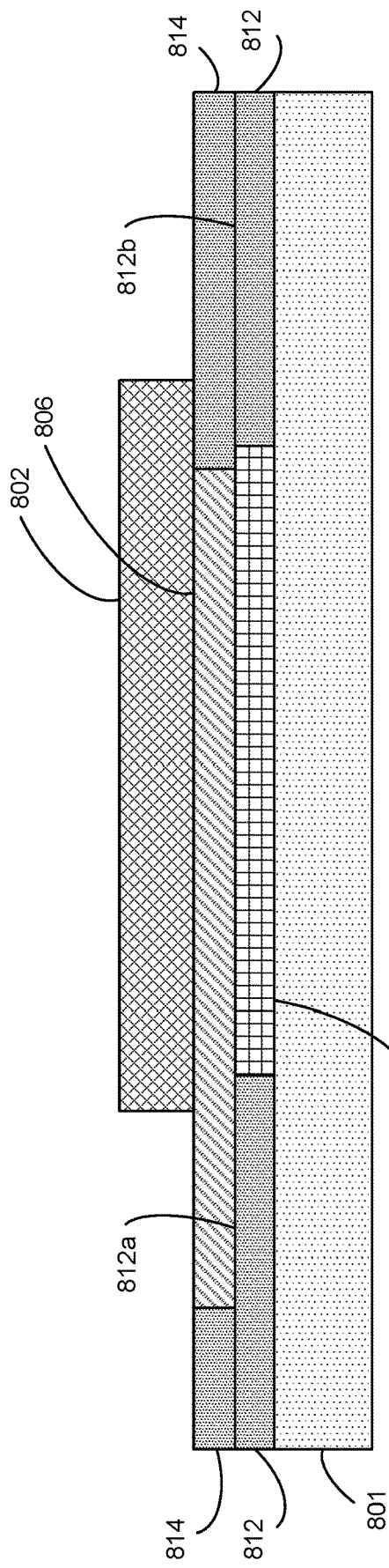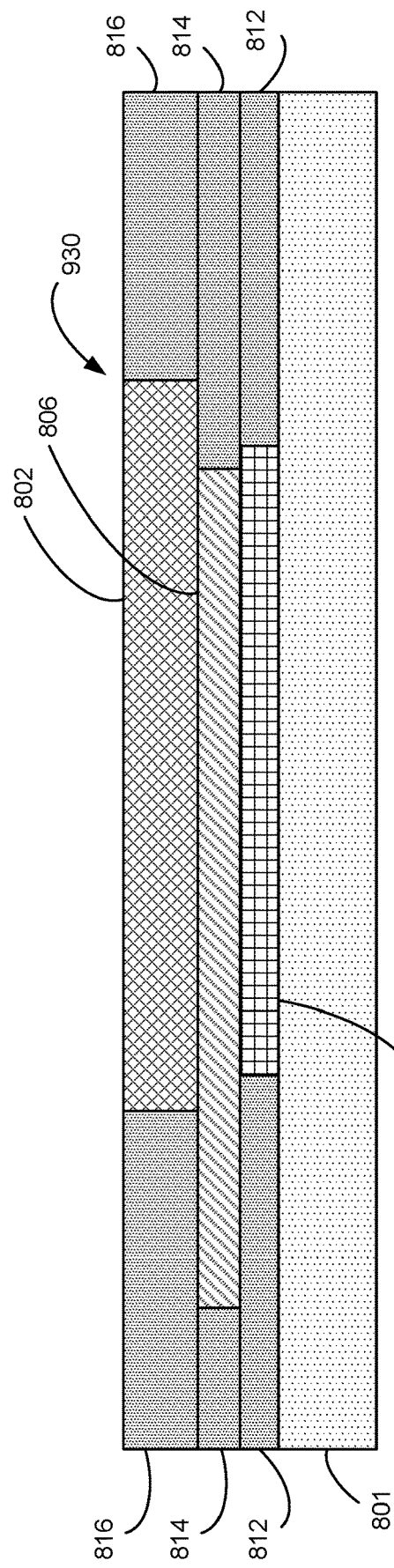

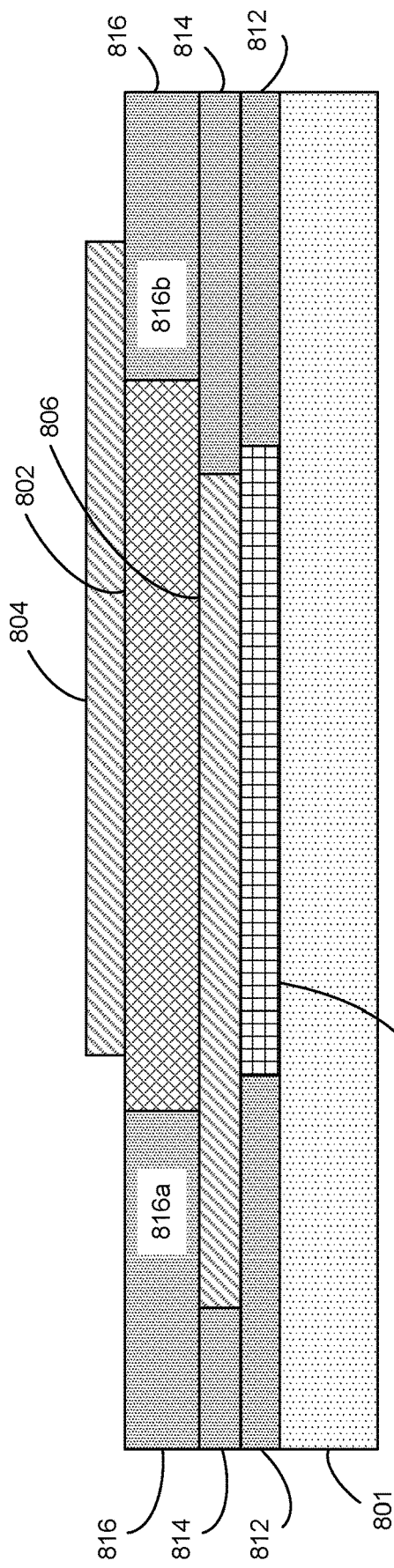
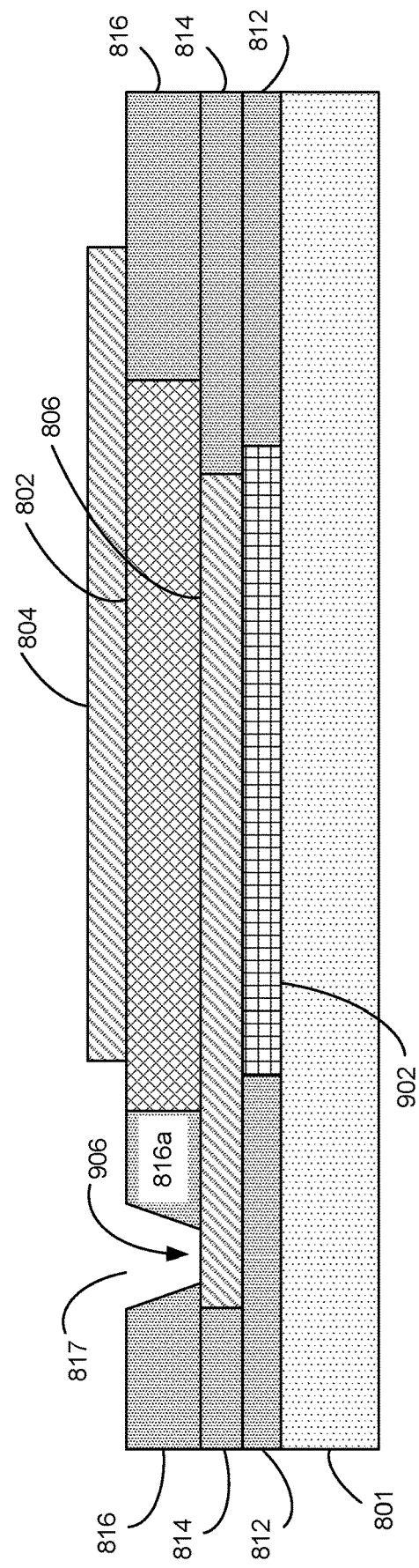
Figure 9H
Figure 9I

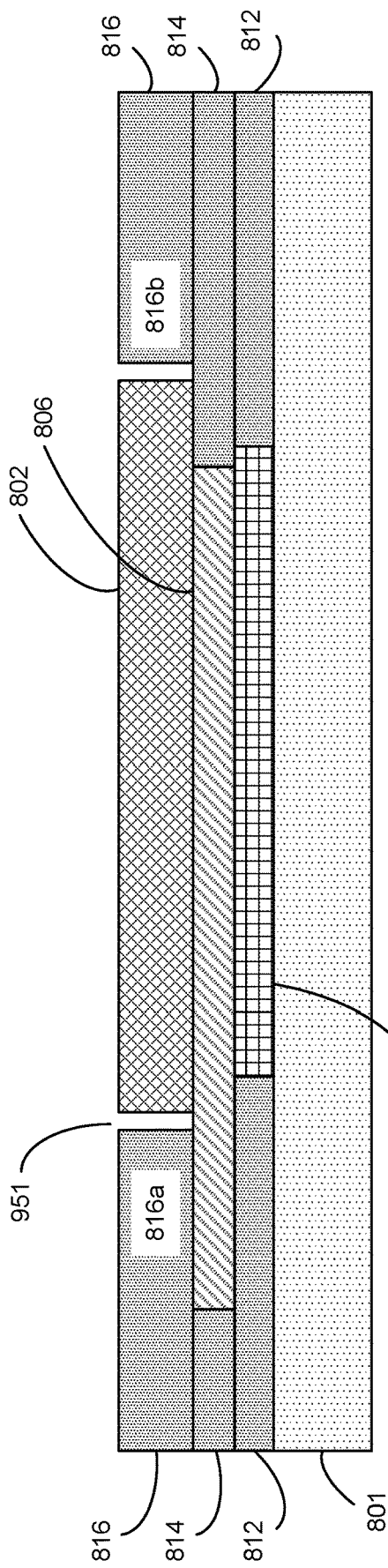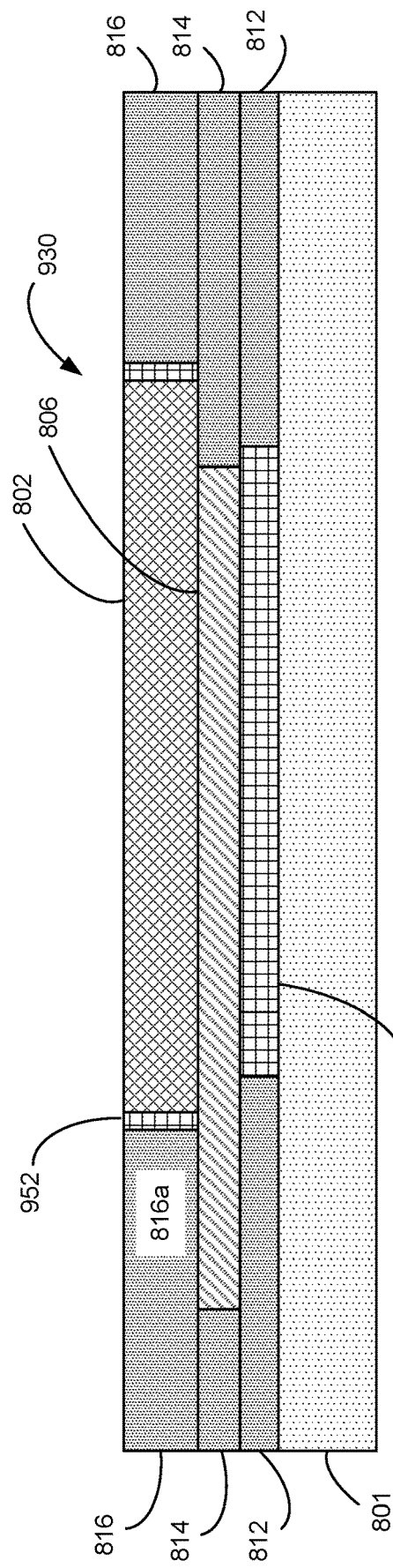

SUPPORT STRUCTURE FOR BULK ACOUSTIC WAVE RESONATOR

RELATED APPLICATIONS

This application is a continuation-in-part of U.S. patent application Ser. No. 16/455,627, filed Jun. 27, 2019, which claims priority to U.S. Provisional Patent Application No. 62/701,382, filed Jul. 20, 2018, entitled, "Support Structure for Bulk Acoustic Wave Resonator," each of which is hereby incorporated by reference in its entirety.

TECHNICAL FIELD

The disclosed embodiments relate generally to bulk acoustic resonators, and in particular, to film bulk acoustic resonators with structures for improved manufacturability and reduced thermal resistance.

BACKGROUND

A bulk acoustic wave (BAW) resonator includes a stack of a bottom electrode, a piezoelectric thin film layer, and a top electrode. (The bottom electrode, the piezoelectric thin film layer, and the top electrode are collectively referred to herein as the "stack.") When an electrical signal is applied to the top and bottom electrodes, the piezoelectric thin film layer converts the electrical energy of the signal into mechanical energy (also referred to herein as acoustical energy). An oscillating electrical signal applied to the piezoelectric thin film layer causes pressure and/or shear waves to propagate through the bulk of the BAW stack. The waves in the stack are referred to as bulk acoustic waves. The bulk acoustic waves have their primary resonance in the stack at frequencies that are determinable from the thicknesses of the piezoelectric film and electrode layers.

For high performance operation, acoustic isolation of a resonator stack from a substrate is necessary to reduce leakage of acoustical energy generated by the resonator stack into the surrounding structure. Acoustic isolation of the resonator stack has been achieved by creating a cavity that separates the resonator stack from the substrate on which the resonator stack is formed. For example, a resonator stack is fabricated over a silicon oxide sacrificial layer that is deposited on a silicon substrate. Metal columns are formed in vias created in the silicon oxide layer. The silicon oxide layer is etched by a liquid etchant to create a cavity between the resonator stack and the substrate, leaving the resonator stack suspended on metal columns. A resonator stack that is suspended over a cavity and only supported by metal columns is vulnerable to stability issues. Additionally, using a liquid etchant to remove the silicon oxide layer endangers circuit elements, which are vulnerable to damage by the etchant.

Another existing approach to acoustic isolation of a resonator stack involves etching a cavity into a substrate, filling the cavity with sacrificial material, and, after forming the resonator stack over the sacrificial material, removing the sacrificial material to form a cavity under the resonator stack. With this approach, there is a lack of control over the cavity depth and shape due to the lack of an etch stop and the crystallographic dependence of the etch profile.

BAW resonators are typically designed to resonate at a particular frequency (thereby acting as a filter). The frequency at which the BAW resonator resonates is affected by changes in temperature. As the BAW resonator resonates, the motion of the resonator generates heat, causing temperature changes that have the potential to cause the filter's pass band and rejection band frequencies to shift out of the specification tolerance.

SUMMARY

Without limiting the scope of the appended claims, after considering this disclosure, and particularly after considering the section entitled "Detailed Description," one will understand how the aspects of various embodiments are used to address the issues described above (e.g., by improving structural integrity of the structure that supports the BAW stack). For example, supporting a BAW stack over a cavity using a cavity frame and planarization material improves the structural integrity of the resonator. In some embodiments, one or more elements of the BAW resonator described herein (e.g., a cavity frame and/or a heat dissipation) dissipate heat generated in the resonator stack.

In some embodiments, a bulk acoustic resonator includes a stack, formed over a substrate, where the stack includes a piezoelectric film element, a first electrode (e.g., a bottom electrode) coupled to a first side of the piezoelectric film element, and a second electrode (e.g., a top electrode) that is coupled to a second side of the piezoelectric film element. A cavity is positioned between the stack and the substrate. The resonator also includes one or more planarizing layers, including a first planarizing layer around the cavity, wherein a first portion of the first electrode is adjacent the cavity and a second portion of the first electrode is adjacent the first planarizing layer. The stack is configured to resonate in response to an electrical signal applied between the first electrode and the second electrode.

In some embodiments, a bulk acoustic resonator is prepared by a process that includes forming, on a substrate, a layer of sacrificial material. The process also includes forming, around the layer of sacrificial material, a first planarizing layer such that the first planarizing layer forms a first planarized surface together with the layer of sacrificial material, and forming a stack over the substrate. Forming the stack over the substrate includes forming a first electrode (e.g., bottom electrode) over the first planarized surface, whereby a first portion of the first electrode is formed on the layer of sacrificial material and a second portion of the first electrode is formed on the first planarizing layer; forming a piezoelectric film element over the first electrode; and forming a second electrode (e.g., top electrode) over the piezoelectric film element. The process further includes removing at least a portion of the layer of sacrificial material to form a cavity between the stack and the substrate. The stack of the resulting bulk acoustic resonator is configured to resonate in response to an electrical signal applied between the first electrode and the second electrode.

In some embodiments, a cavity includes one or more posts that support the stack and/or one or more elements of the stack is perforated by a plurality of perforations that reduce resonance of spurious waves (e.g., as described with regard to U.S. application Ser. No. 15/789,109, filed Oct. 20, 2017, entitled, "Firm Bulk Acoustic Resonator with Spurious Resonance Suppression," which is hereby incorporated by reference in its entirety).

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 6A-6I illustrate an approach for formation of a bulk acoustic resonator that involves etching sacrificial layer material to form a cavity, in accordance with some embodiments.

FIGS. 7A-7B illustrate a flowchart representation of a process for forming a bulk acoustic resonator, in accordance with some embodiments.

FIGS. 9A-9J illustrate an approach for fabricating a bulk acoustic resonator including forming one or more planarizing layers, in accordance with some embodiments.

FIGS. 9M-9N illustrate an approach for fabricating a bulk acoustic resonator including forming one or more planarizing layers and an air reflector around a piezoelectric film element, in accordance with some embodiments.

Figure 1:
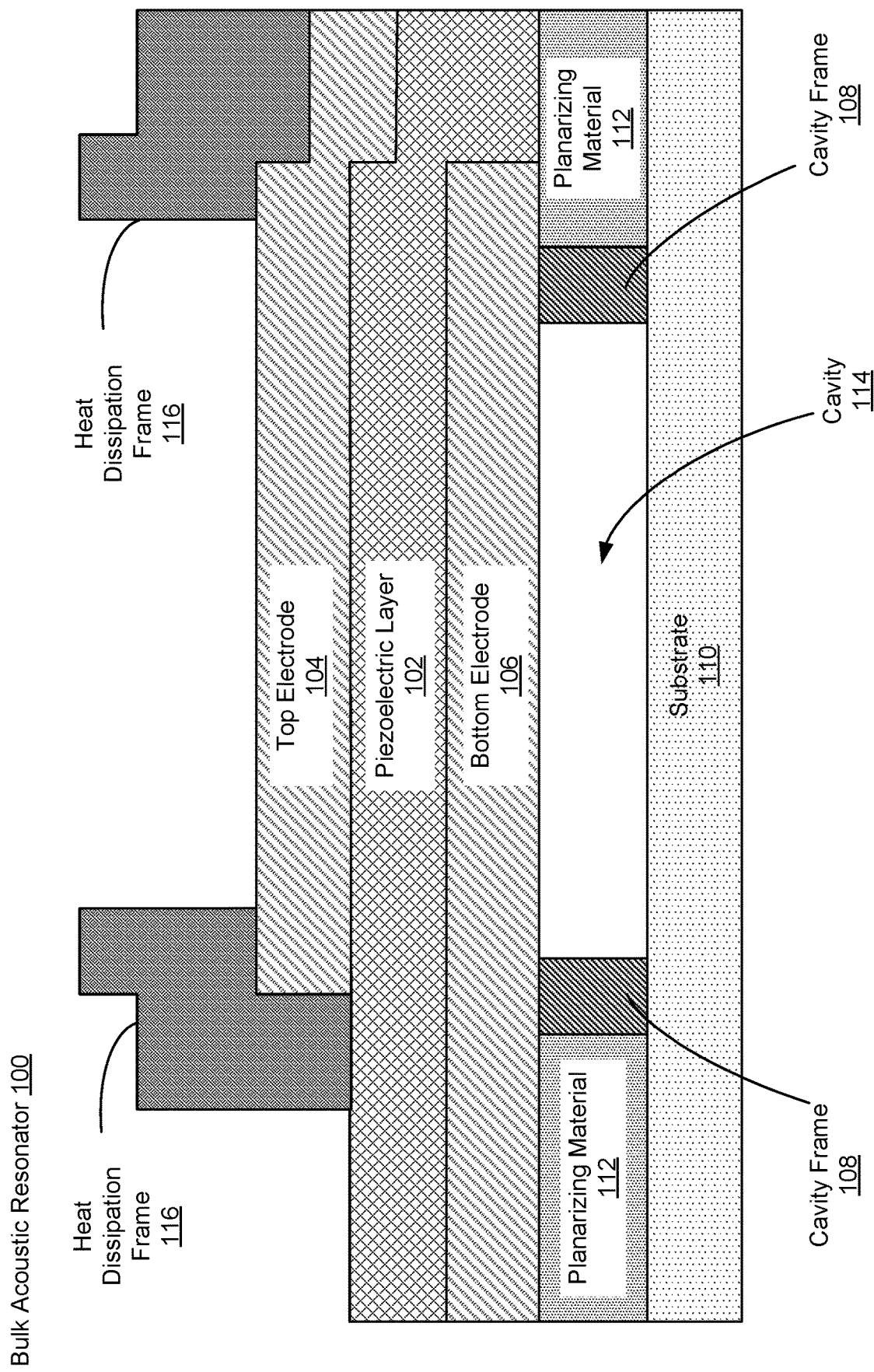
FIG. 1 is a cross-sectional diagram of a bulk acoustic resonator, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to improve the resonator's performance, structural integrity and thermal stability of the BAW resonator.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1 is a cross-sectional diagram of a BAW resonator 100, in accordance with some embodiments. BAW resonator 100 includes a stack of a top electrode 104 coupled to a first side of a piezoelectric layer 102 and a bottom electrode 106 coupled to a second side of piezoelectric layer 102. The stack resonates in response to an electrical signal applied between the top electrode 104 and the bottom electrode 106.

Figure 3:
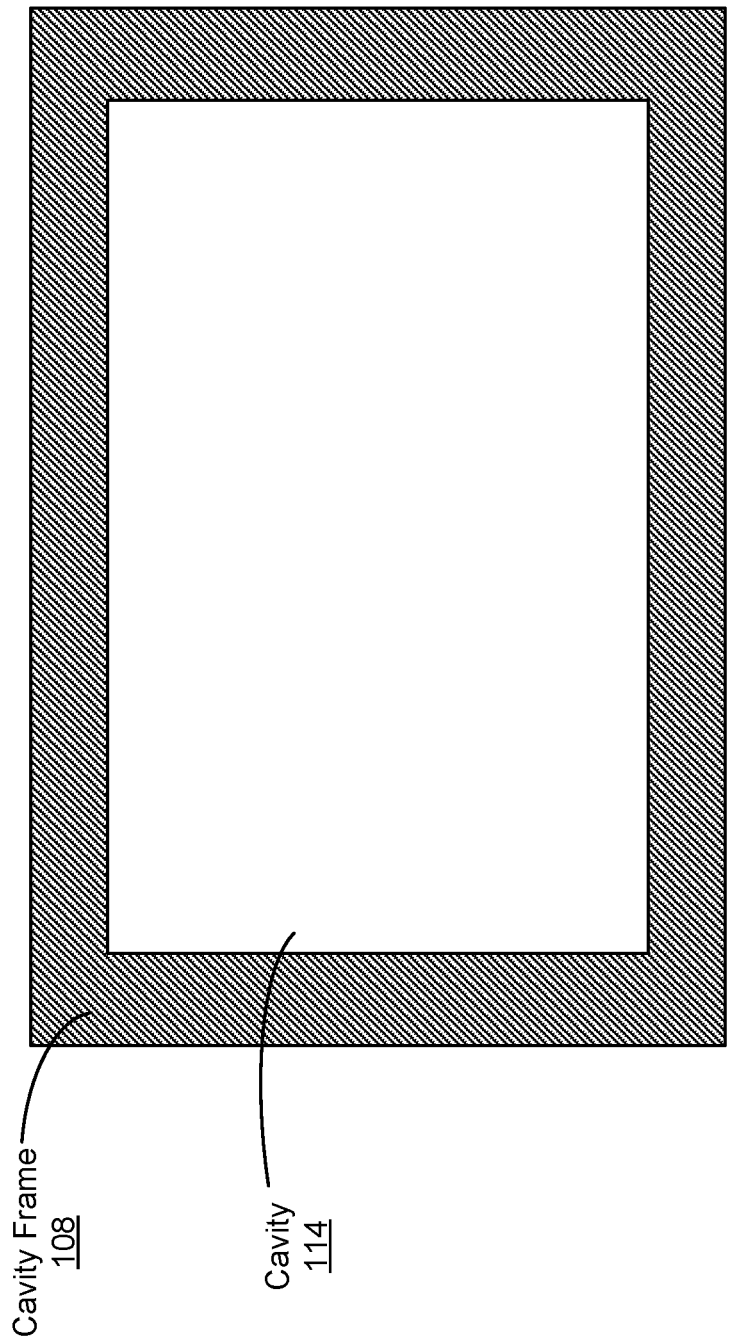
FIG. 3 is a top-down view of a cavity frame of a bulk acoustic resonator, in accordance with some embodiments.

In some embodiments, the stack of piezoelectric layer 102, top electrode 104, and bottom electrode 106 is supported with respect to a substrate 110 by cavity frame 108. Cavity frame 108 is formed with an opening (e.g., a rectangular opening) that passes through cavity frame 108, such that cavity frame 108 forms a perimeter that surrounds cavity 114 (e.g., as illustrated by FIG. 3). In some embodiments, the stack is supported with respect to a substrate 110 by planarizing material 112. A top down view of planarizing material 112 in BAW resonator 100 is provided in FIG. 4. In some embodiments, the stack is supported by cavity frame 108 and planarizing material 112.

Figure 2:
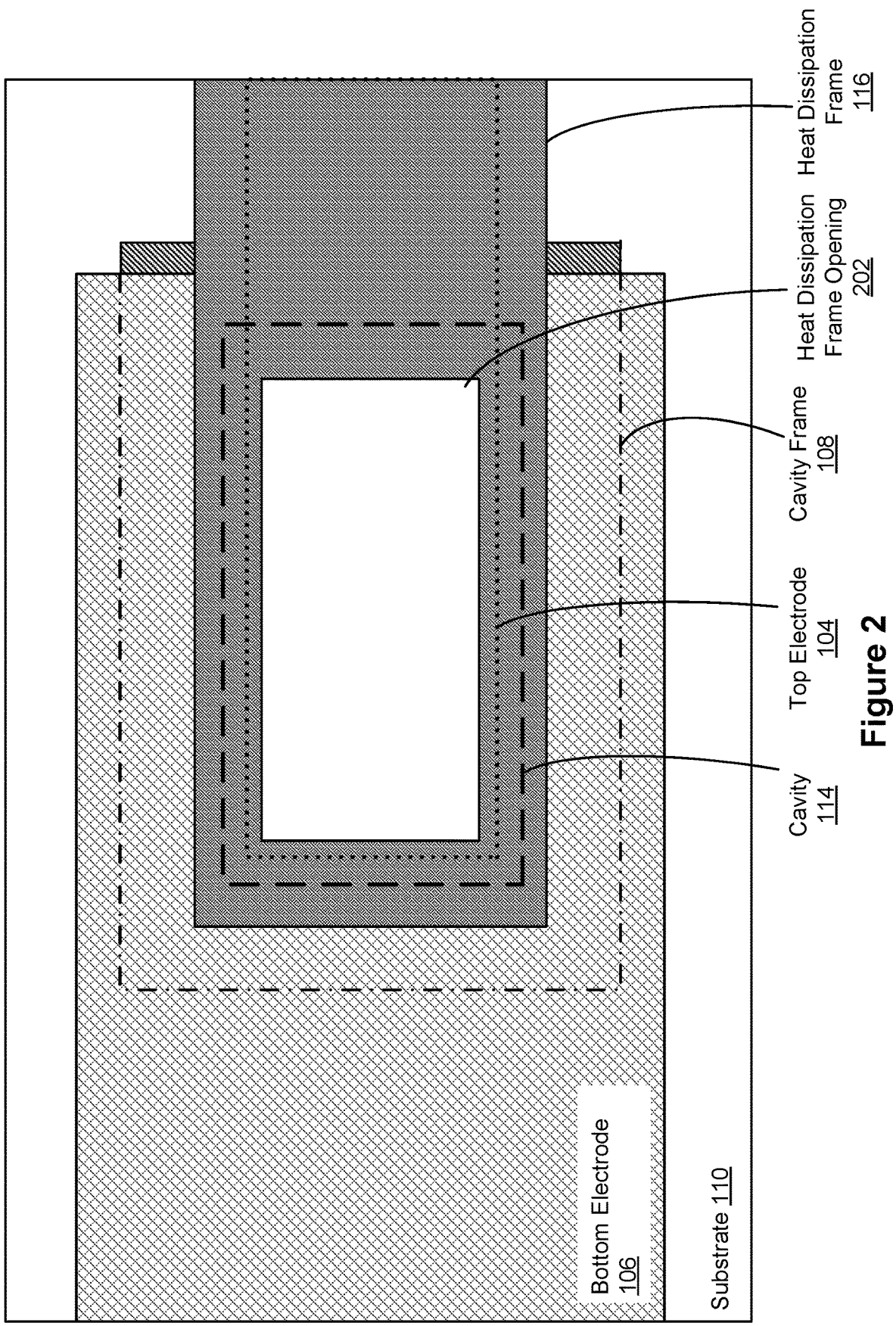
FIG. 2 is a layout view that illustrates a bulk acoustic resonator, in accordance with some embodiments.

Cavity 114 provides a space between the substrate 110 and the stack. The open space below the stack, formed by cavity 114, and the open space above the stack (including an opening 202 in heat dissipation frame 116 as illustrated in FIG. 2), allows the stack to resonate freely in response to the electrical signal. Including cavity frame 108 and/or planarizing material 112 in a support structure provides a high degree of structural integrity in the portion of the structure of BAW resonator 100 that supports the stack suspended over cavity 114.

Figure 5:
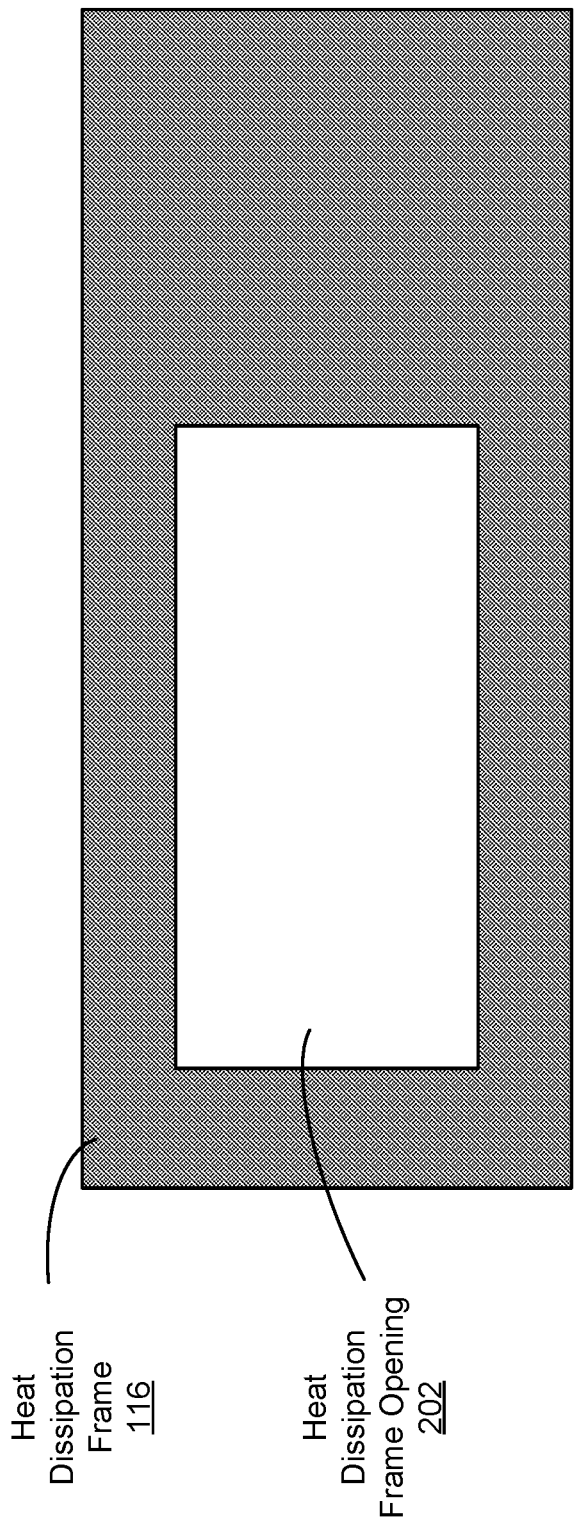
FIG. 5 is a top-down view of a heat dissipation frame of a bulk acoustic resonator, in accordance with some embodiments.

In some embodiments, BAW resonator includes a heat dissipation frame 116 that is coupled to top electrode 104. A top-down view of heat dissipation frame 116 is illustrated by FIG. 5.

In some embodiments, cavity frame 108 and/or heat dissipation frame 116 are formed from or include a material with high thermal conductivity (e.g., aluminum, gold, copper, silver, or diamond) and/or high electrical conductivity (e.g., aluminum, gold, copper, or silver). A cavity frame 108 and/or heat dissipation frame 116 that includes a high thermal conductivity material dissipates heat (e.g., "self-heat" that is generated by the device as the BAW resonator resonates). In this way, temperature-induced frequency shift behavior of the BAW resonator 100 is reduced and/or avoided. For example, a device that includes a heat dissipation frame 116 that is thicker than top electrode 106 and formed from a higher conductivity material than top electrode 106 will provide improved heat dissipation over a device that relies on top electrode 106 for heat dissipation. A cavity frame 108 and/or heat dissipation frame 116 that includes a high electrical conductivity material reduces electrical resistance of the device, improving quality factors (Qs) of the device (e.g., improving the performance of the BAW resonator 100 in a filter).

In some embodiments, cavity frame 108 is formed from a material that results in an acoustic impedance of the cavity frame 108 that varies to a high degree from the acoustic impedance of the BAW stack (e.g., including top electrode 104, piezoelectric layer 102 and bottom electrode 106). The resulting acoustic impedance mismatch between the cavity frame 108 and the BAW stack reduces acoustic energy leakage from the edges of the device. In some embodiments, heat spreader ring 116 is formed from a material that results in an acoustic impedance of the heat spreader ring 116 that varies to a high degree from the acoustic impedance of the BAW stack. The resulting acoustic impedance mismatch between the heat spreader ring 116 and the BAW stack reduces acoustic energy leak from the edges of the device.

FIG. 2 is a layout view of a BAW resonator 100. For clarity, planarizing material 112 and piezoelectric layer 102 are omitted from FIG. 2. A top down view of planarizing material 112 is shown in FIG. 4.

FIG. 3 is a top-down view of a cavity frame 108 of a bulk acoustic resonator, in accordance with some embodiments. In some embodiments, cavity frame 108 has a medial opening (e.g., a rectangular opening in cavity frame 108) that extends through the cavity frame layer (e.g., from the upper surface to the lower surface of the cavity frame layer). Sacrificial material deposited on substrate 110 is removed to form cavity 114 at a location that corresponds to the opening of the cavity frame. In some embodiments, the medial opening in cavity frame 108 is substantially centered along one or more axes of the cavity frame 108.

Figure 4:
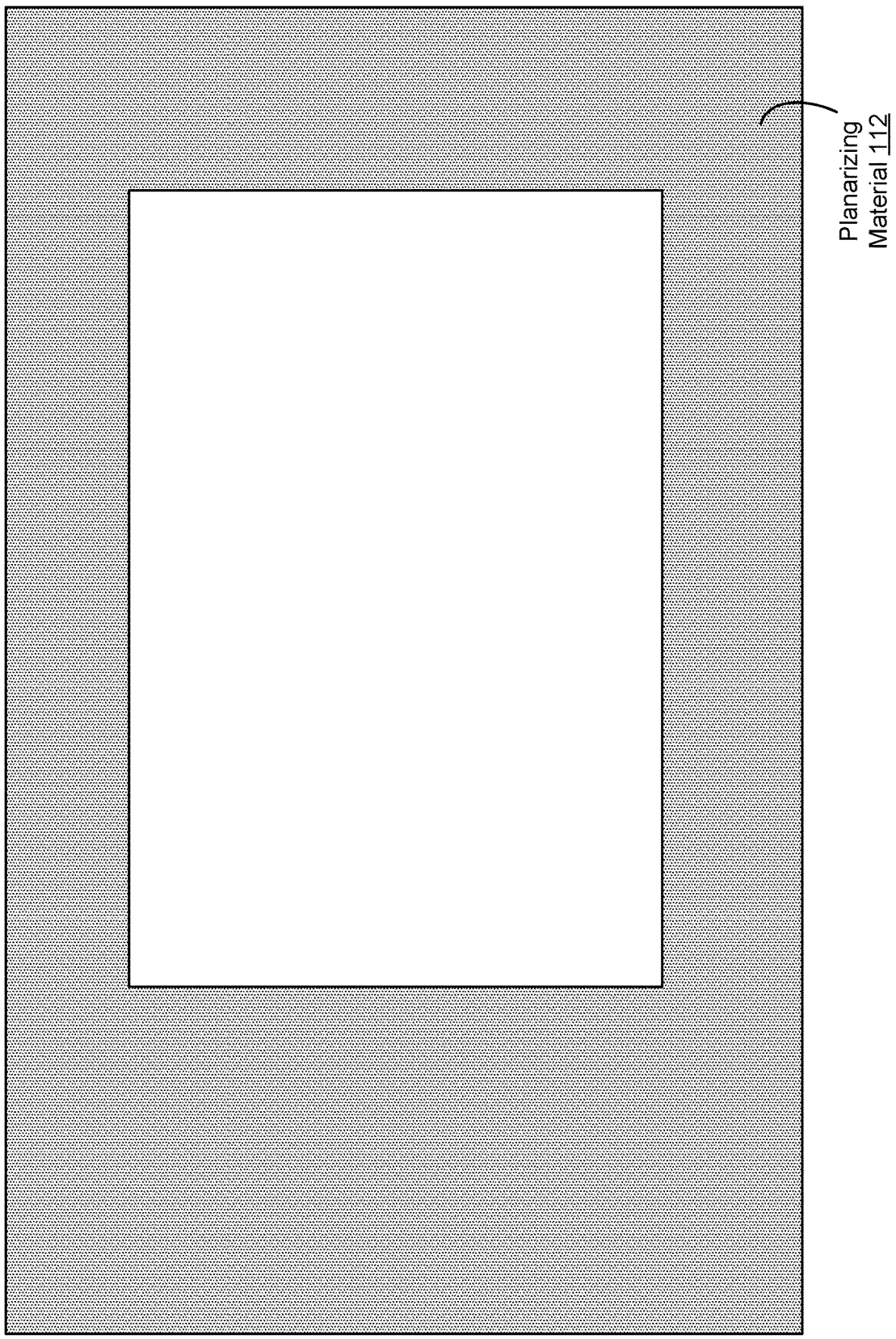
FIG. 4 is a top-down view of planarizing material of a bulk acoustic resonator, in accordance with some embodiments.

FIG. 4 is a top-down view of planarizing material 112 of a bulk acoustic resonator, in accordance with some embodiments. In some embodiments, planarizing material 112 forms a perimeter around cavity frame 108 in planarized layer 604 (see FIG. 6D).

FIG. 5 is a top-down view of a heat dissipation frame 116 of a bulk acoustic resonator, in accordance with some embodiments. In some embodiments, heat dissipation frame 116 has a medial opening 202 (e.g., a rectangular opening in the heat dissipation frame 116) that extends through the heat dissipation frame 116 (e.g., from the upper surface to the lower surface of the heat dissipation frame layer). In some embodiments, medial opening 202 is substantially centered along one or more axes of the heat dissipation frame 116.

FIGS. 6A-6I illustrate cross-sectional views of a bulk acoustic resonator during formation of the bulk acoustic resonator 100, where formation of the bulk acoustic resonator 100 involves etching sacrificial layer material to form a cavity 114, in accordance with some embodiments.

In FIG. 6A, a layer of sacrificial material 602 (e.g., silicon dioxide), is formed (e.g., by chemical vapor deposition) on a substrate 110 (e.g., silicon, glass, ceramic, gallium arsenide and/or silicon carbide). The sacrificial material is patterned (e.g., using a mask and chemical etching) such that sacrificial material 602 occupies an area on substrate 110 that corresponds to the ultimate location of cavity 114.

In FIG. 6B, cavity frame 108 is formed (e.g., by e-beam evaporation) around sacrificial material 602. The cavity frame is patterned (e.g., using a mask during the e-beam evaporation) such that cavity frame 108 forms a perimeter around sacrificial material 602 (see FIGS. 1-3).

In FIG. 6C, a planarizing material 112 (e.g. polysilicon) is formed (e.g., by chemical vapor deposition) on the substrate 110, cavity frame 108, and sacrificial material 108.

Figure 6D:
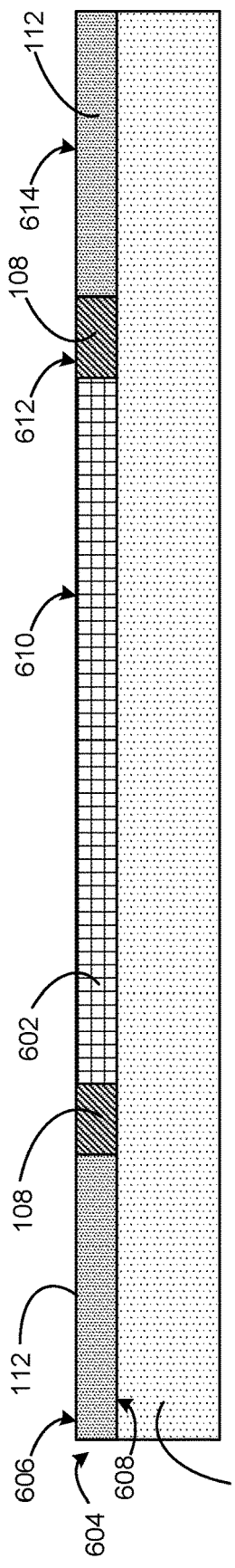

In FIG. 6D, planarizing material 112 is planarized (e.g., by chemical mechanical polishing) to form a level upper surface 606 of a planarized layer 604 that includes planarizing material 112, cavity frame 108, and sacrificial material 602. Planarized layer 604 is formed on, and thus positioned on top of, substrate 110.

Figure 6E:
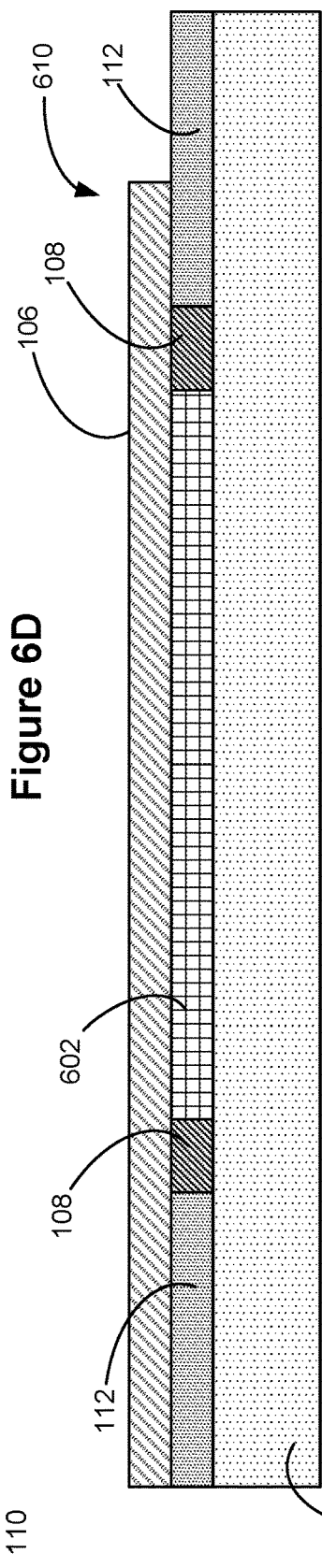

In FIG. 6E, a bottom electrode layer 106 (e.g., molybdenum, aluminum, and/or tungsten) is formed (e.g., by physical vapor deposition) over the planarized layer that includes planarizing material 112, cavity frame 108, and sacrificial material 602. In some embodiments, bottom electrode layer 106 is patterned (e.g., using a mask during the physical vapor deposition) such that bottom electrode layer 106 occupies a region indicated by bottom electrode layer 106 in FIG. 2.

Figure 6F:
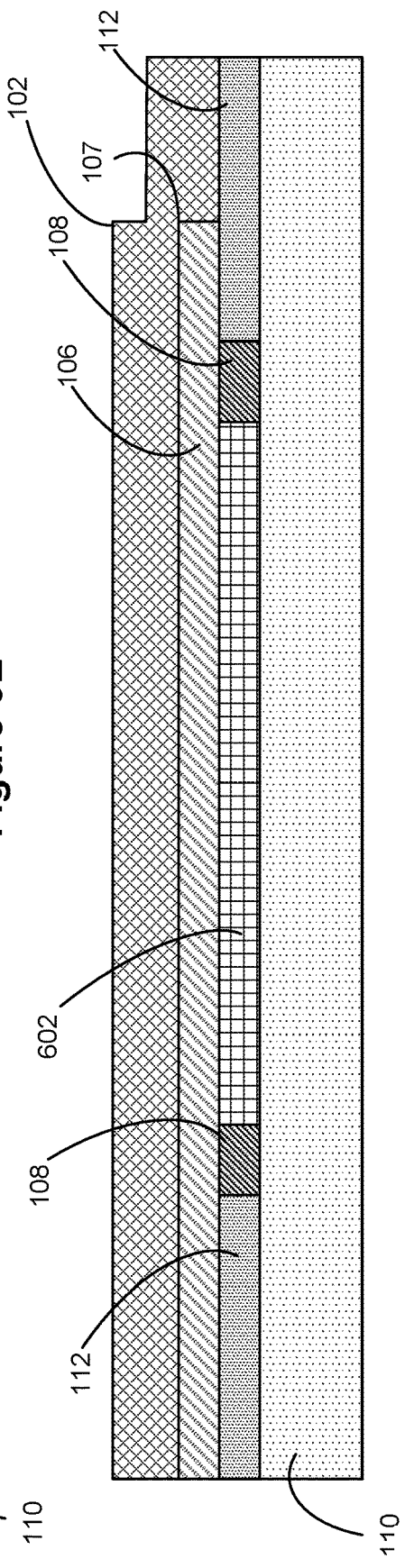

In FIG. 6F, a piezoelectric film layer 102 (e.g., aluminum nitride and/or zinc oxide) is formed (e.g., by physical vapor deposition) over bottom electrode layer 106.

Figure 6G:
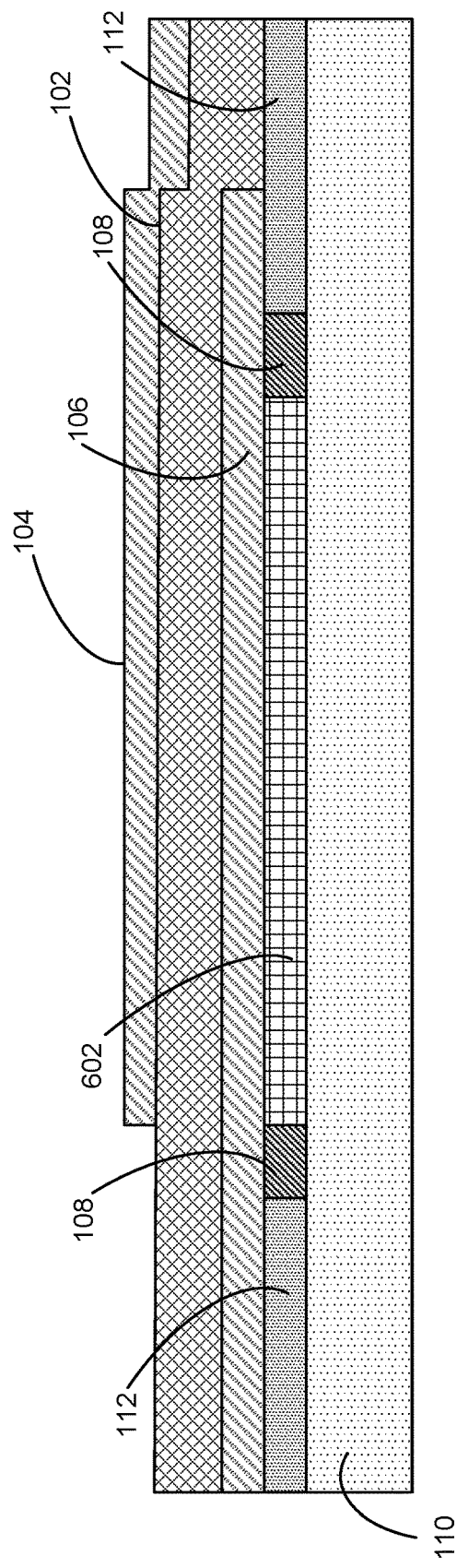

In FIG. 6G, a top electrode layer 104 (e.g., molybdenum, aluminum, and/or tungsten) is formed over the piezoelectric film layer 102. In some embodiments, top electrode layer 104 is patterned (e.g., using a mask during the physical vapor deposition) such that top electrode layer 104 occupies the region indicated by top electrode layer 104 in FIG. 2.

Figure 6H:
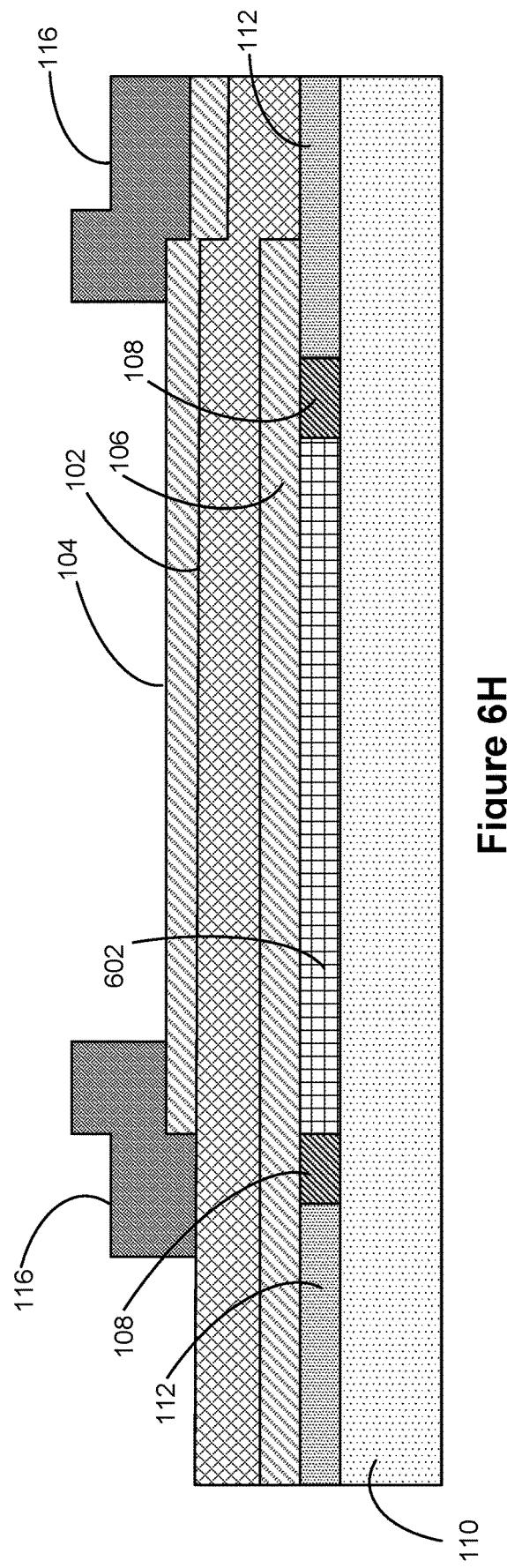

In FIG. 6H, heat dissipation frame 116 is formed (e.g., by e-beam evaporation) over top electrode layer 104. In some embodiments, heat dissipation frame 116 is patterned (e.g., using a mask during the e-beam evaporation) such that it occupies a region as indicated in FIG. 2.

In FIG. 6I, cavity 114 is formed by removing sacrificial material 602 (e.g., by vapor HF etching) from beneath bottom electrode 106. Vapor HF etching advantageously reduces the etch time (e.g., compared with liquid HF) and provides a clean surface of the bottom electrode. In some embodiments, the cavity 114 has a depth and shape that corresponds to the opening of cavity frame 108. In this way, the formation of cavity frame 108 allows formation of a cavity with a predetermined depth and shape.

Process 700 for forming a bulk acoustic resonator 100 (as described below with regard to FIGS. 7A-7B) involves, e.g., deposition, oxidation, lithography patterning, etch, liftoff, and/or chemical mechanical planarization processes, in appropriate sequences, as described below. While these sequences of operations, and the resulting bulk acoustic resonators, are new, the techniques needed to perform each of the individual steps or operations of these processes are well understood in the art, and therefore the individual processing steps or operations are not described in detail. The dotted lines in process 700 illustrate optional operations.

Figure 7A:
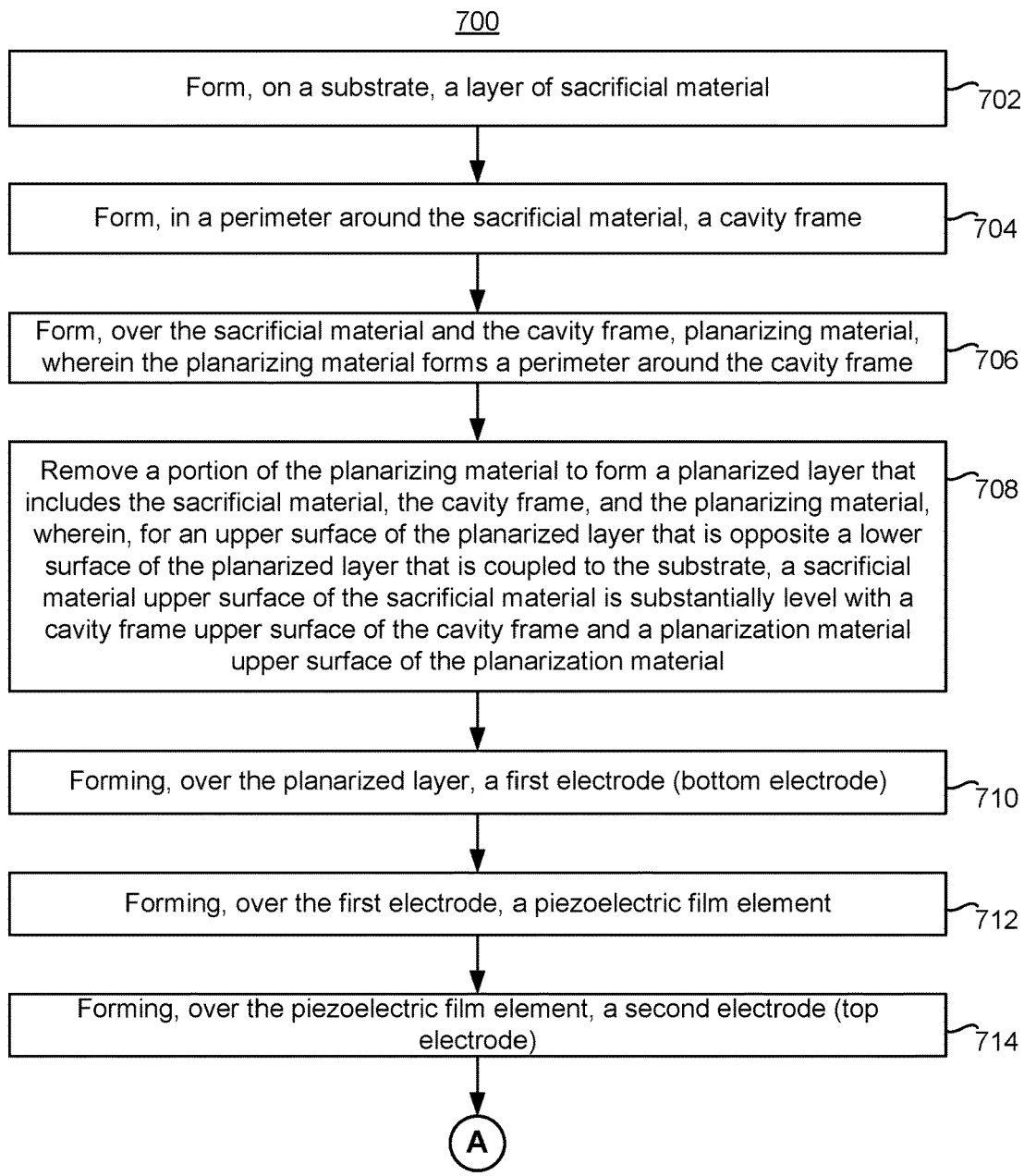

FIGS. 7A-7B illustrates a flowchart representation of a process 700 for forming a bulk acoustic resonator 100 in accordance with some embodiments.

A layer of sacrificial material 602 is formed (702) on a substrate 110 (e.g., as described with regard to FIG. 6A).

A cavity frame 108 is formed (704) in a perimeter around the sacrificial material 602 (e.g., as described with regard to FIG. 6B)

Planarizing material 112 is formed (706) over the sacrificial material 602 and the cavity frame 108 (e.g., as described with regard to FIG. 6C). The planarizing material 112 forms a perimeter around the cavity frame 108.

A portion of the planarizing material 112 is removed (708) to form a planarized layer 604 that includes the sacrificial material 602, the cavity frame 108, and the planarizing material 112 (e.g., as described with regard to FIG. 6D). For an upper surface 606 of the planarized layer 604 that is opposite a lower surface 608 of the planarized layer that is coupled to the substrate 110, a sacrificial material upper surface 610 of the sacrificial material 602 is substantially level with a cavity frame upper surface 612 of the cavity frame 108 and a planarization material upper surface 614 of the planarization material 112 (e.g., as described with regard to FIG. 6D).

A first electrode (bottom electrode 106) is formed (710) over the planarized layer (e.g., as described with regard to FIG. 6E).

A piezoelectric film element 102 is formed (712) over the first electrode (e.g., as described with regard to FIG. 6F).

A second electrode (top electrode 104) is formed (714) over the piezoelectric film element 102 (e.g., as described with regard to FIG. 6G).

In some embodiments, a heat dissipation frame 116 is formed (716) over the second electrode 104 (e.g., as described with regard to FIG. 6H).

In some embodiments, the heat dissipation frame 116 includes (718) a medial opening 202 that passes through the heat dissipation frame 116 (e.g., as illustrated in FIGS. 1-2).

In some embodiments, the heat dissipation frame 116 includes (720) at least one material selected from the group consisting of aluminum, copper, silver, gold, and diamond. In some embodiments, the heat dissipation frame 116 is formed from one or more materials that have a thermal conductivity at 20° C. of at least 200 W/(m K).

At least a portion of the sacrificial material 602 is removed (722) to form a cavity 114 (e.g., as described with regard to FIG. 6I).

In some embodiments, the cavity 114 is bounded (724) by the first electrode 106, the substrate 110, and the cavity frame 108 (e.g., as illustrated by FIGS. 2-3 and FIG. 6I).

In some embodiments, the cavity frame 108 is configured to dissipate (726) heat generated by the stack. In some embodiments, the cavity frame 108 is formed from one or more materials that have a thermal conductivity at 20° C. of at least 200 W/(m K).

In some embodiments, the cavity frame 108 includes (728) at least one material selected from the group consisting of aluminum, copper, silver, gold, and diamond.

Thus, process 700 can be used to form the bulk acoustic resonator 100 in accordance with some embodiments. As discussed above, to prevent or reduce the formation of parasitic resonators and the loss of acoustic energy, the bottom electrode layer 106 in BAW resonator 100 is patterned such that bottom electrode layer 106 occupies a region indicated by bottom electrode layer 106 in FIG. 2, by, for example, removing the conducting bottom electrode material from outside of the region. The patterned bottom electrode 106 presents a non-planar surface 610, as shown in FIG. 6E, on which the piezoelectric film is deposited, as shown in FIG. 6F. This non-planar surface 610 can cause problems in the piezoelectric film 102 at the edge 107 of the bottom electrode 106, making the piezoelectric film 102 easy to crack near the edge 107 of the bottom electrode 106 during subsequent processing and/or eventual product operation.

Special etching method has been proposed to create shallow-angle and smoother edges for the bottom electrode. This method, however, is not only difficult to implement in actual manufacturing processes, it also causes the piezoelectric film to have crystalline structures near the edges that are not properly aligned in the vertical direction, thus degrading the quality of the piezoelectric film near the edges and the performance of the BAW resonator.

Furthermore, a typical BAW resonator structure deposits a blanket piezoelectric film over the substrate with the bottom electrode formed thereon and leaves the blanket piezoelectric film there for subsequent processing. As a result, portions of the piezoelectric film outside of an active area of the BAW resonator (e.g., defined as an area where the top electrode, the piezoelectric film and the bottom electrode overlap) could provide a medium for lateral acoustic waves generated in the resonator to leak out of the resonator, causing acoustic energy loss.

Therefore, in some embodiments, after the bottom electrode is patterned, a second planarizing layer is formed around the patterned bottom electrode to provide a planar surface on which to form a high-quality and uniform-stress PZ film. The second planarizing layer may include a filler material selected form a group of dielectric materials, such as polysilicon. In some embodiments, the piezoelectric film is patterned to remove an outer portion thereof leaving just a piezoelectric film element in the active region. In some embodiments, an air reflector is formed around the piezoelectric film element to further reduce leakage of acoustic energy.

Figure 8A:
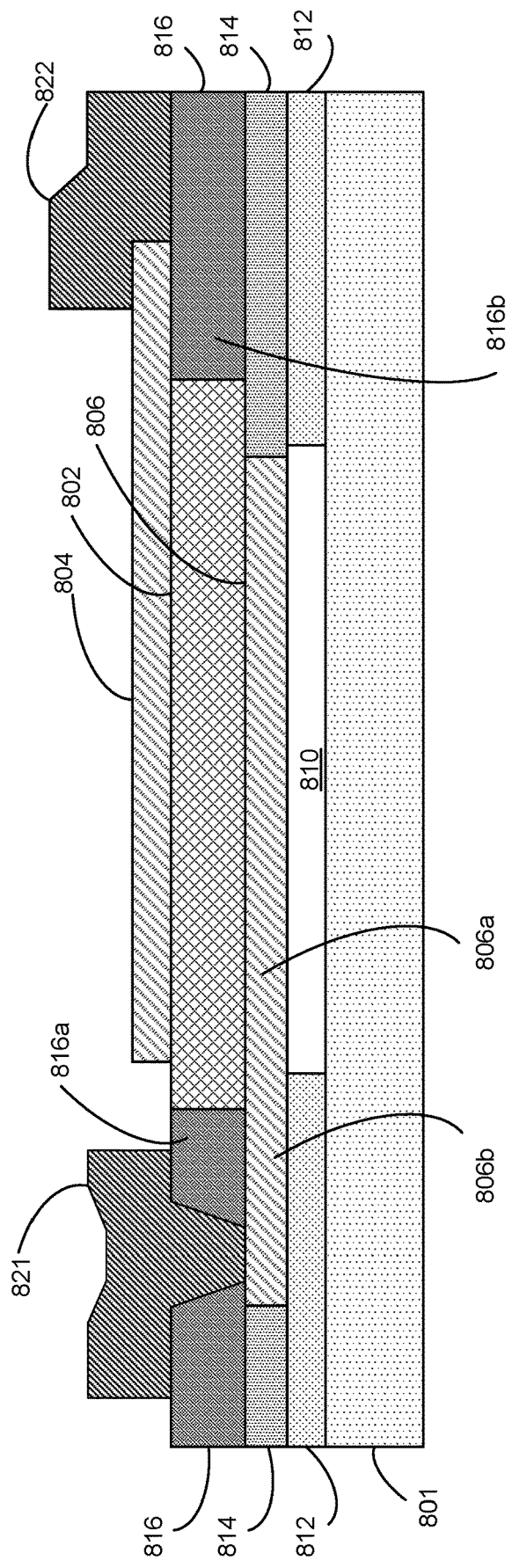
FIG. 8A is a cross-sectional diagram of a bulk acoustic resonator, in accordance with some embodiments.

FIG. 8A is a cross-sectional diagram of a BAW resonator 800, in accordance with some embodiments. BAW resonator 800 includes a stack formed over a substrate 801 and a cavity 810 between the stack and the substrate 801. The stack includes a piezoelectric film element 802; a first electrode (or bottom electrode) 806 coupled to a first side (the side facing the substrate 801) of the piezoelectric film element 802, and a second electrode (top electrode) 804 coupled to a second side (the side facing away from the substrate 801) of the piezoelectric film element 802. Bulk acoustic resonator 800 further includes one or more planarizing layers, such as a first planarizing layer 812 around the cavity 810, a second planarizing layer 814 around the first electrode 806, and a third planarizing layer 816 around the piezoelectric film element 802. Bulk acoustic resonator 800 further includes one or more metal contacts 821 electrically coupled to the first electrode 806, and one or more metal contact 822 electrically coupled to the second electrode 804.

In some embodiments, first planarizing layer 812 is included to provide a first flat surface together with a sacrificial layer occupying a space of the cavity 810, over which the first electrode 806 is formed during fabrication of BAW resonator 800. In some embodiments, second planarizing layer 814 is included to provide a second flat surface, over which the piezoelectric film element 802 is formed during fabrication of BAW resonator 800. In some embodiments, third planarizing layer 816 is used to provide a third flat surface, over which the second electrode is formed during fabrication of BAW resonator 800. In some embodiments, a first portion 806a of the bottom electrode is adjacent the cavity and a second portion 806b of the bottom electrode is adjacent the first planarizing layer 812. In some embodiments, first planarizing layer 812, second planarizing layer 814, and/or third planarizing layer 816 include polysilicon.

Figure 8B:
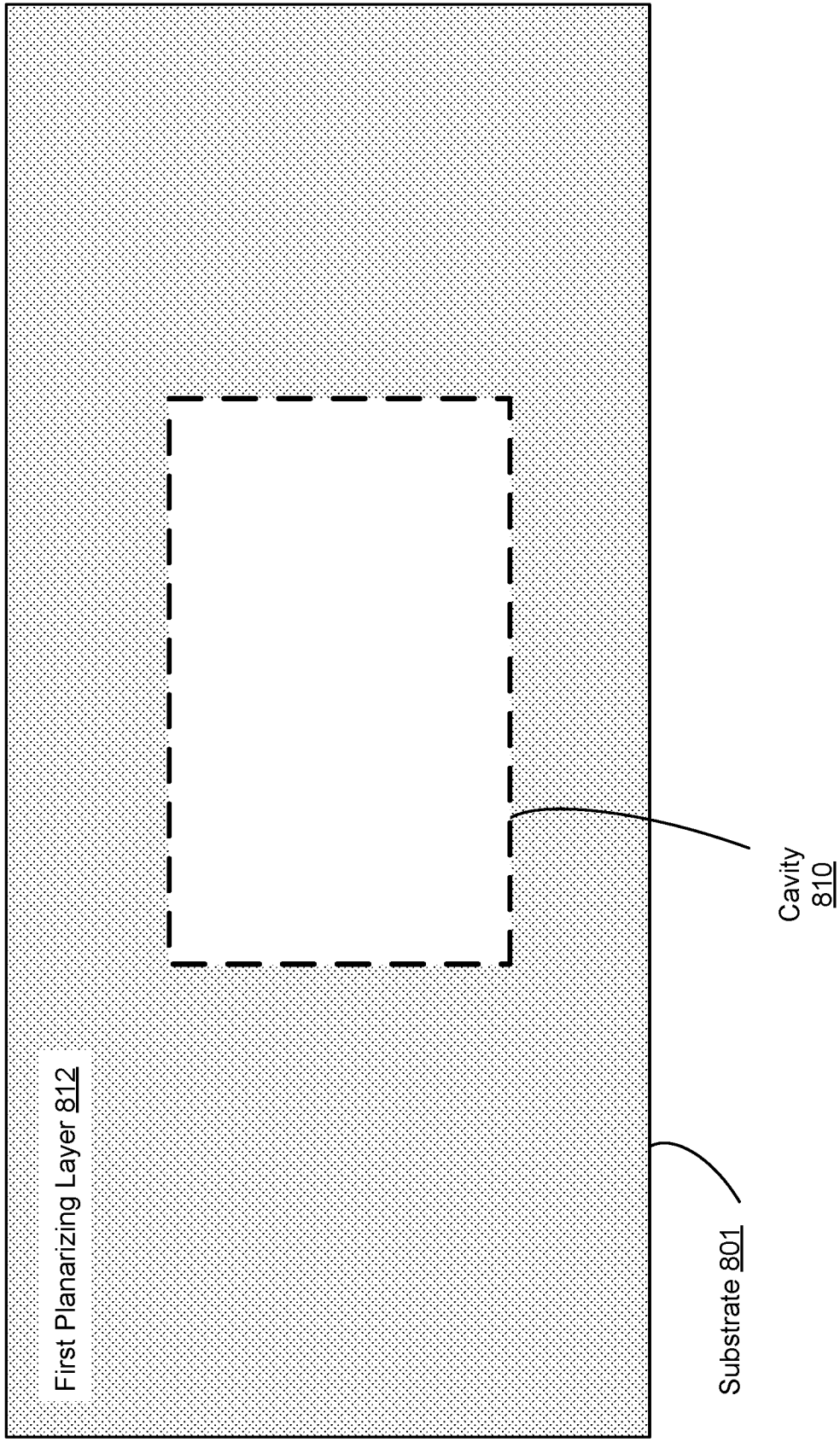
FIGS. 8B-8E are a layout views that illustrate planarizing layers in a bulk acoustic resonator, in accordance with some embodiments.

In some embodiments, the stack of piezoelectric film element 802, top electrode 804, and bottom electrode 806 is supported with respect to a substrate 801 by first planarizing layer 812. A top down view of first planarizing layer 812 in BAW resonator 800 is provided in FIG. 8B. As shown, first planarizing layer 812 surrounds cavity 810 and has an inner perimeter that borders cavity 810. In some embodiments, a cavity frame (e.g., cavity frame 108) is also included and is formed around the cavity, and first planarizing layer 812 is formed around the cavity frame. First planarizing layer 812 (and the cavity frame if included), together with a sacrificial material occupying a space of the cavity, form a first planarized surface, over which first (bottom) electrode 806 is formed during fabrication of BAW resonator 800, as discussed further below.

Figure 8C:
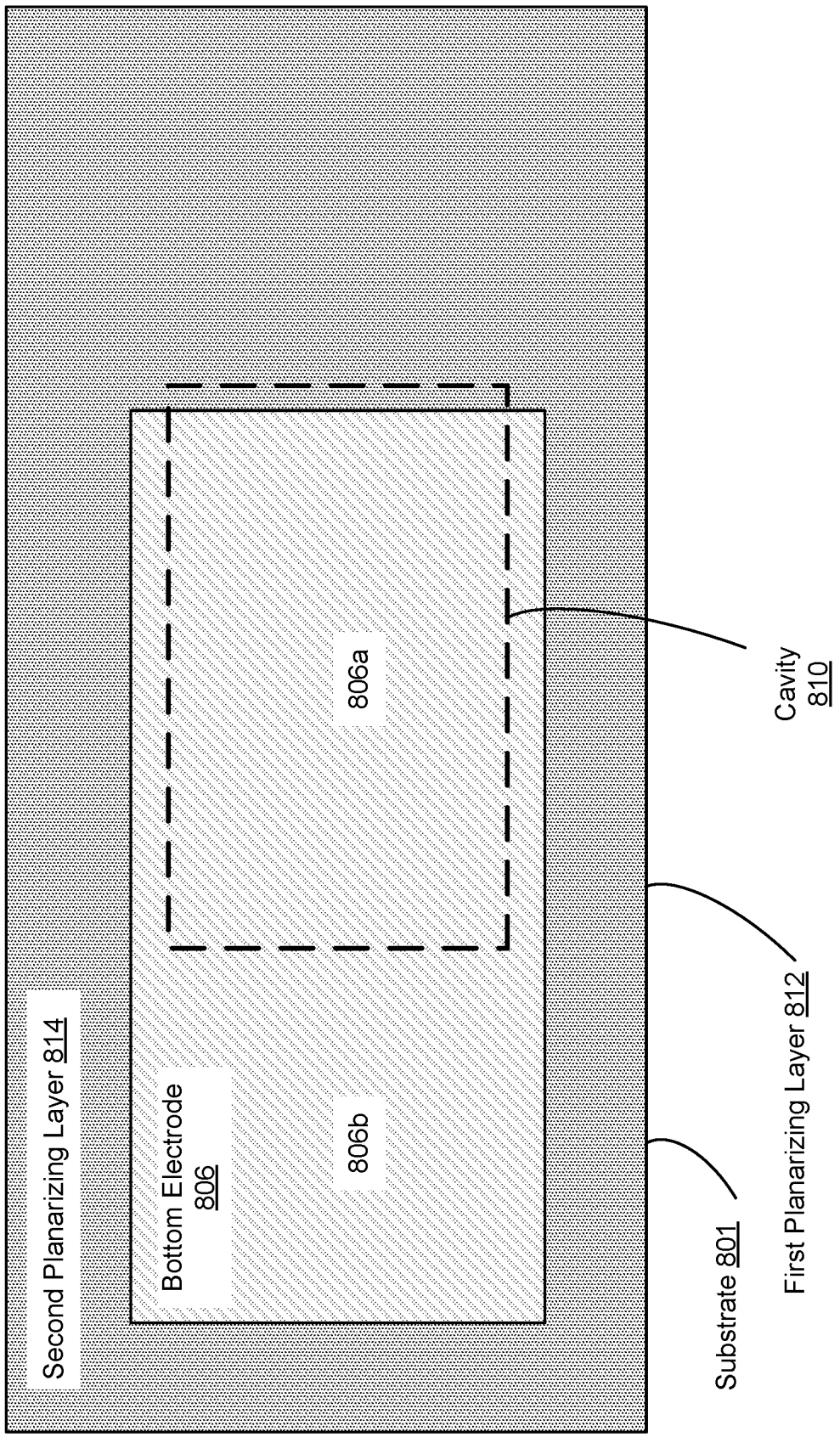

A top down view of second planarizing layer 814 in BAW resonator 800 is provided in FIG. 8C. As shown, second planarizing layer 814 is formed around first (bottom) electrode 806 and has an inner perimeter that abuts an outer perimeter of first (bottom) electrode 806. Second planarizing layer 814, together with first (bottom) electrode 806, form a second planarized surface, over which piezoelectric film element 802 is formed, as discussed further below.

Figure 8D:
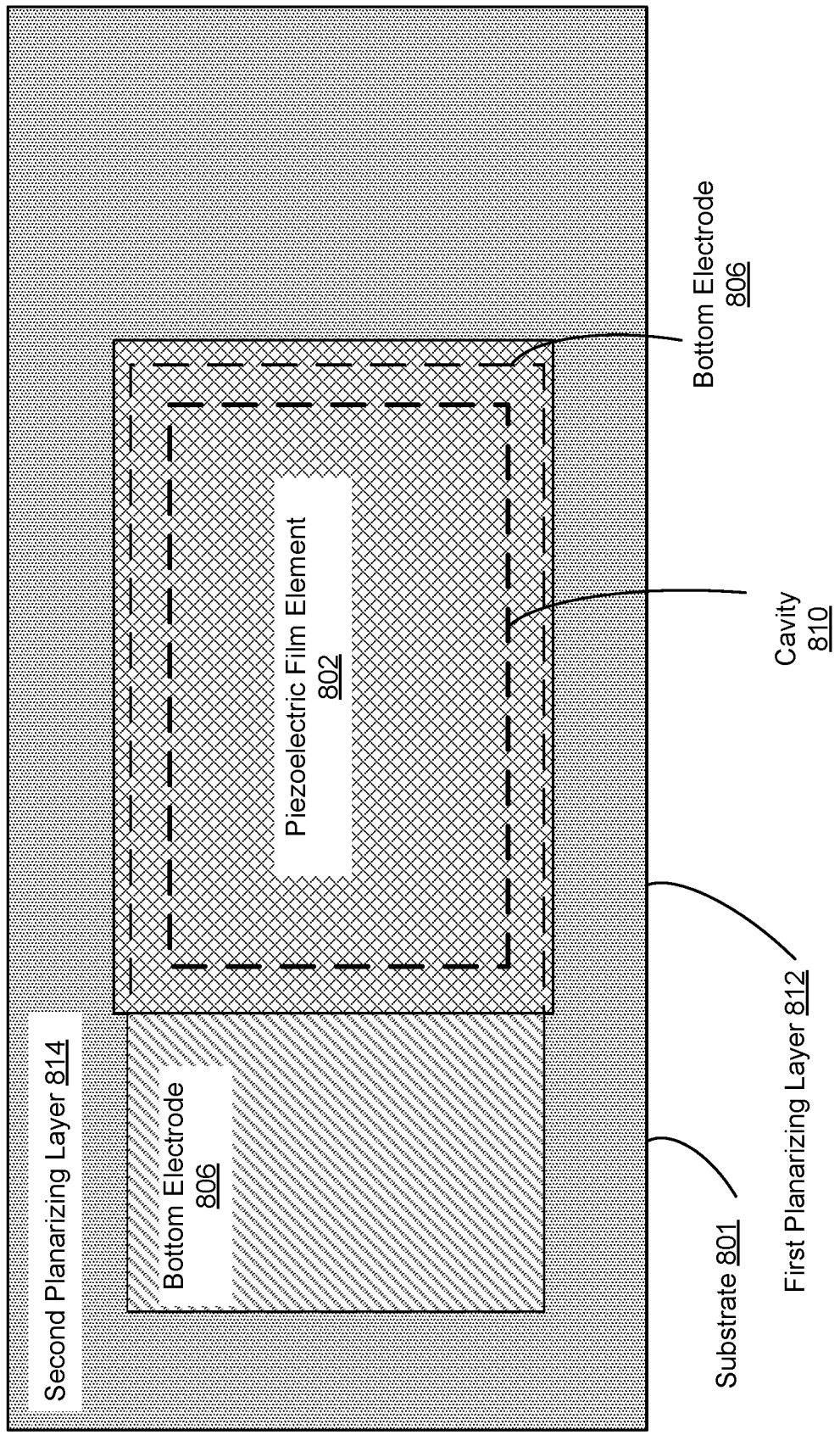

A top down view of third planarizing layer 816 in BAW resonator 800 is provided in FIG. 8D. The plan view in FIG. 8D shows that bottom electrode 806 and second planarizing layer 814 around bottom electrode 806 together provide a flat surface, over which piezoelectric film element 802 is formed.

Figure 8E:
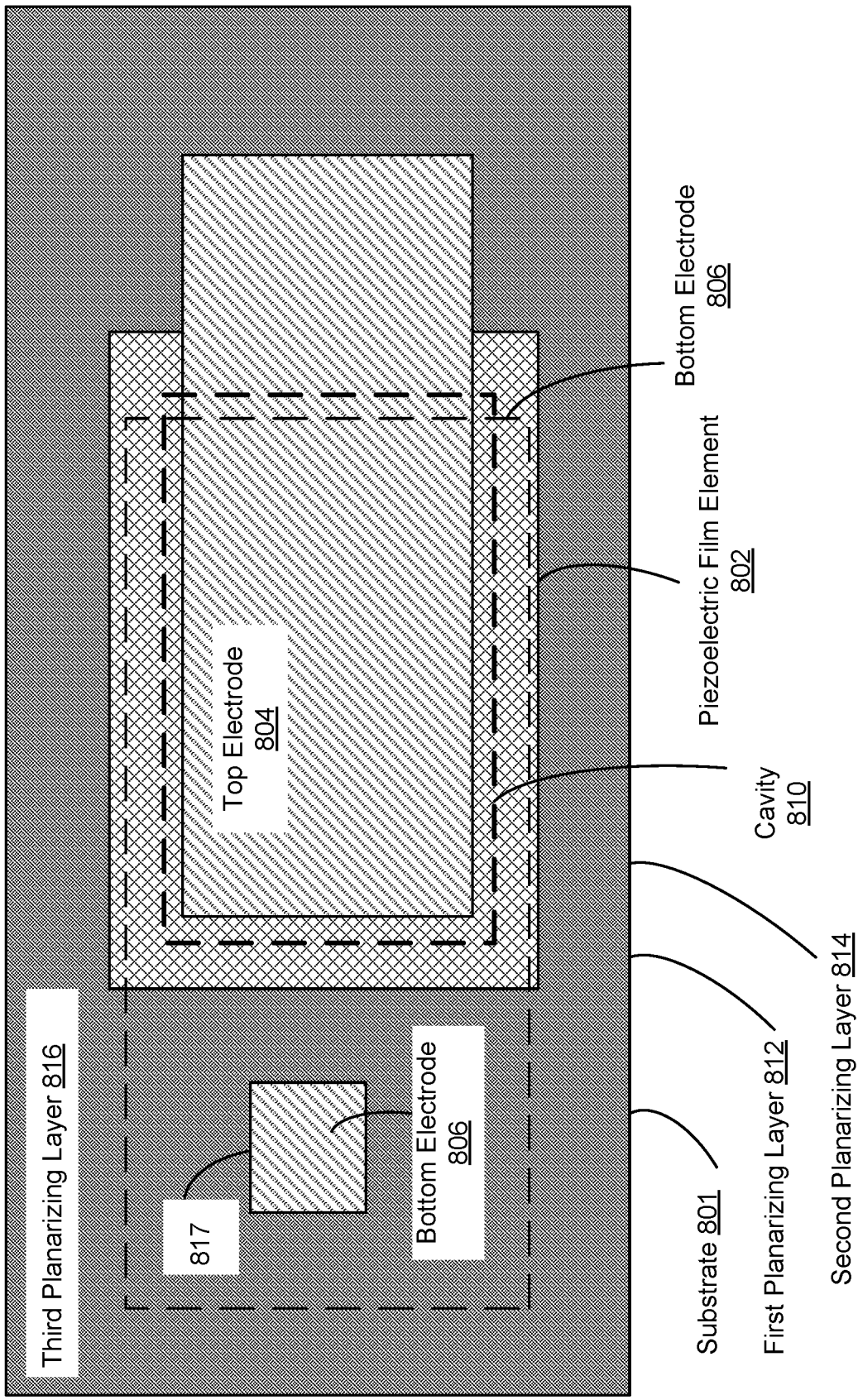

The plan view in FIG. 8E shows that third planarizing layer 816 is formed around piezoelectric film element 802 and has an inner perimeter that abuts an outer perimeter of piezoelectric film element 802. Piezoelectric film element 802 and third planarizing layer 816 together provide a third flat surface, over which top electrode 804 is formed. FIG. 8E also illustrates a contact hole 817 for contact 821 is formed in third planarizing layer 816.

In some embodiments, the stack is configured to resonate in response to an electrical signal applied between the first electrode 806 and the second electrode 804. Cavity 810 provides a space between the substrate 801 and the stack, allowing the stack to resonate freely in response to the electrical signal. In some embodiments, first planarizing layer 812, with or without a cavity frame, forms a support structure providing a high degree of structural integrity in the portion of the structure of BAW resonator 800 that supports the stack suspended over cavity 810.

FIGS. 9A-9J illustrate cross-sectional views of various layers of bulk acoustic resonator 800 during formation of bulk acoustic resonator 800, in accordance with some embodiments.

Figure 9A:
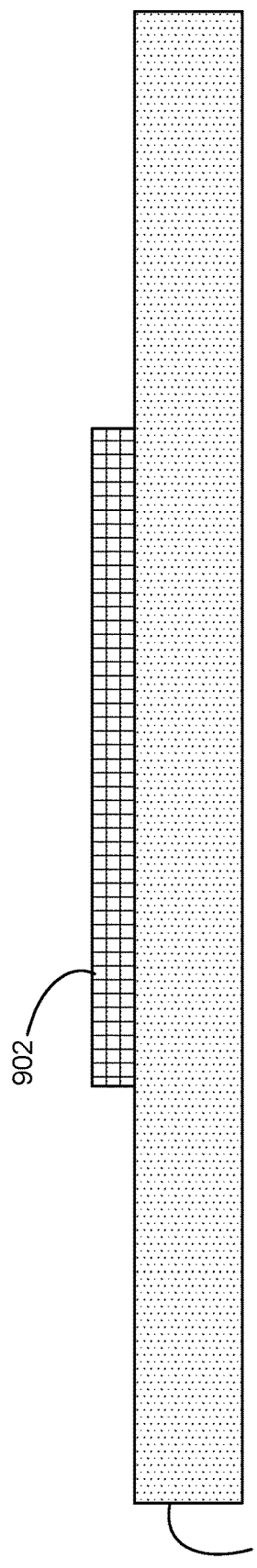

In FIG. 9A, a layer of sacrificial material 902 (e.g., silicon dioxide), is formed (e.g., by chemical vapor deposition) on a substrate 801 (e.g., silicon, glass, ceramic, gallium arsenide and/or silicon carbide). The sacrificial material is patterned (e.g., using a mask and chemical etching) such that the layer of sacrificial material 602 occupies a space of the cavity 810 on substrate 801.

Figure 9B:
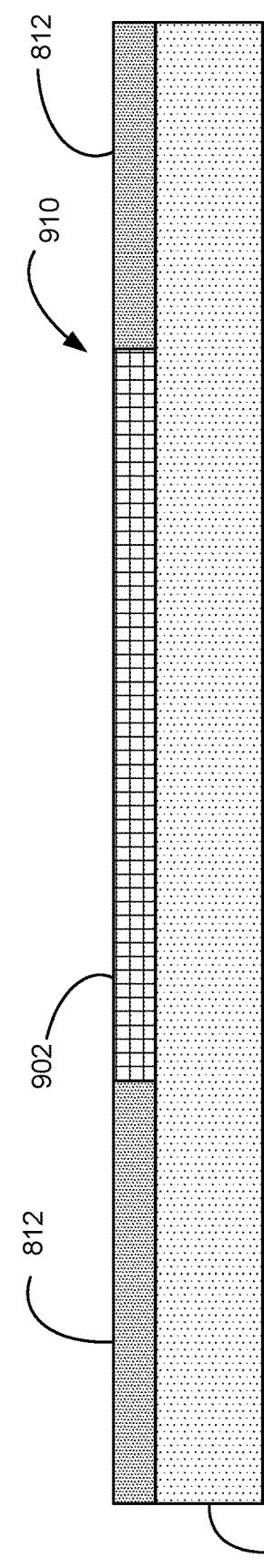

In FIG. 9B, first planarizing layer 812 is formed by, for example, depositing (e.g., using chemical vapor deposition) on substrate 110 and sacrificial material 902 a dielectric material (e.g., polysilicon), which is then planarized (e.g., by chemical mechanical polishing) to form a first planarized surface 910 together with the sacrificial material 902. First planarizing layer 812 is formed on, and thus positioned on top of, substrate 801.

Figure 9C:
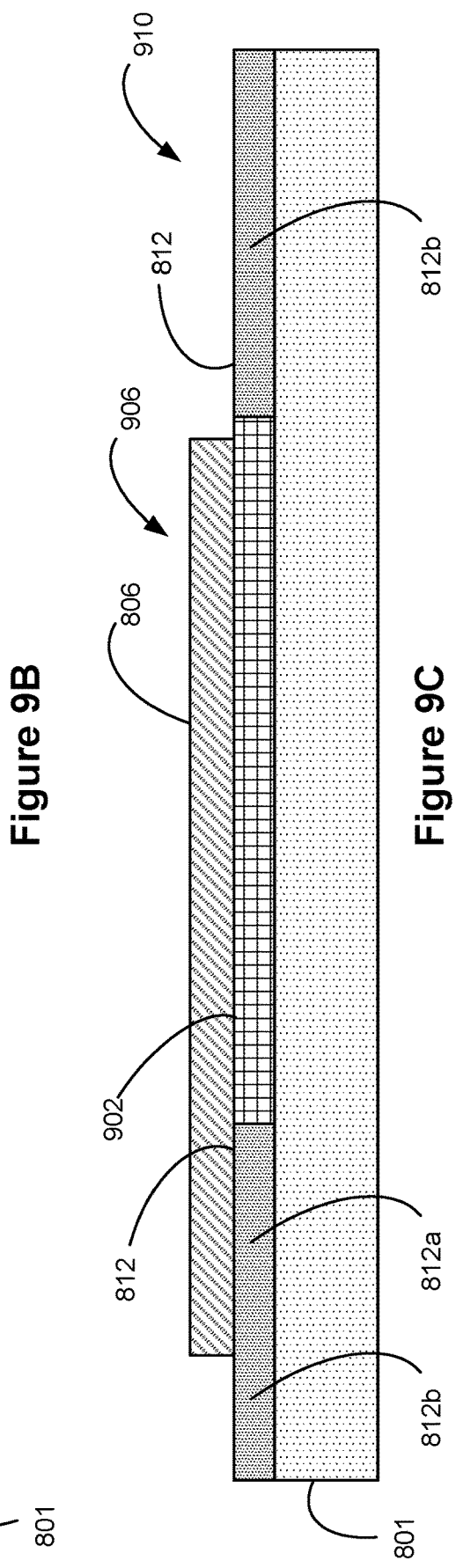

In FIG. 9C, a bottom electrode layer 806 (e.g., molybdenum, aluminum, and/or tungsten) is formed (e.g., by physical vapor deposition) over the first planarized surface 910, whereby a first portion of bottom electrode 806 is formed on the layer of sacrificial material and a second portion of bottom electrode 806 is formed on the first planarizing layer. In some embodiments, bottom electrode layer 806 is patterned (e.g., using a lift-off process) such that bottom electrode 806 occupies a region indicated by bottom electrode layer 806 in FIG. 9C In FIG. 9D, second planarizing layer 814 is formed by, for example, depositing (e.g., using chemical vapor deposition) on bottom electrode 806 and first planarizing layer 812 a dielectric material (e.g., polysilicon), which is then planarized (e.g., by chemical mechanical polishing) to form a second planarized surface 920 together with bottom electrode 806.

In FIG. 9E, a layer of piezoelectric material 902 (e.g., aluminum nitride and/or zinc oxide) is formed (e.g., by physical vapor deposition) over second planarized surface 920.

In FIG. 9F, the layer of piezoelectric material 902 is patterned (e.g., by anisotropic etching) to form piezoelectric film element 802.

In FIG. 9G, third planarizing layer 816 is formed by, for example, depositing (e.g., using chemical vapor deposition) on piezoelectric film element 802 and second planarizing layer 814 a dielectric material (e.g., polysilicon), which is then planarized (e.g., by chemical mechanical polishing) to form a third planarized surface 930 together with piezoelectric film element 802.

In FIG. 9H, a top electrode layer 804 (e.g., molybdenum, aluminum, and/or tungsten) is formed over the piezoelectric film element 802. In some embodiments, top electrode layer 804 is patterned (e.g., using a lift-off process) such that top electrode layer 804 occupies the region indicated by top electrode layer 804 in FIG. 9H. As shown in FIG. 9H, a first portion 816a of the third planarizing layer 816 is adjacent the first electrode 806 but not the second electrode 804 and a second portion 816b of the third planarizing layer 816 is adjacent the second electrode 804 but not the first electrode 806.

In FIG. 9I, one or more contact holes 817 are etched in third planarizing layer 816, exposing a portion of bottom electrode 806 at a bottom of each contact hole 817.

Figure 9J:
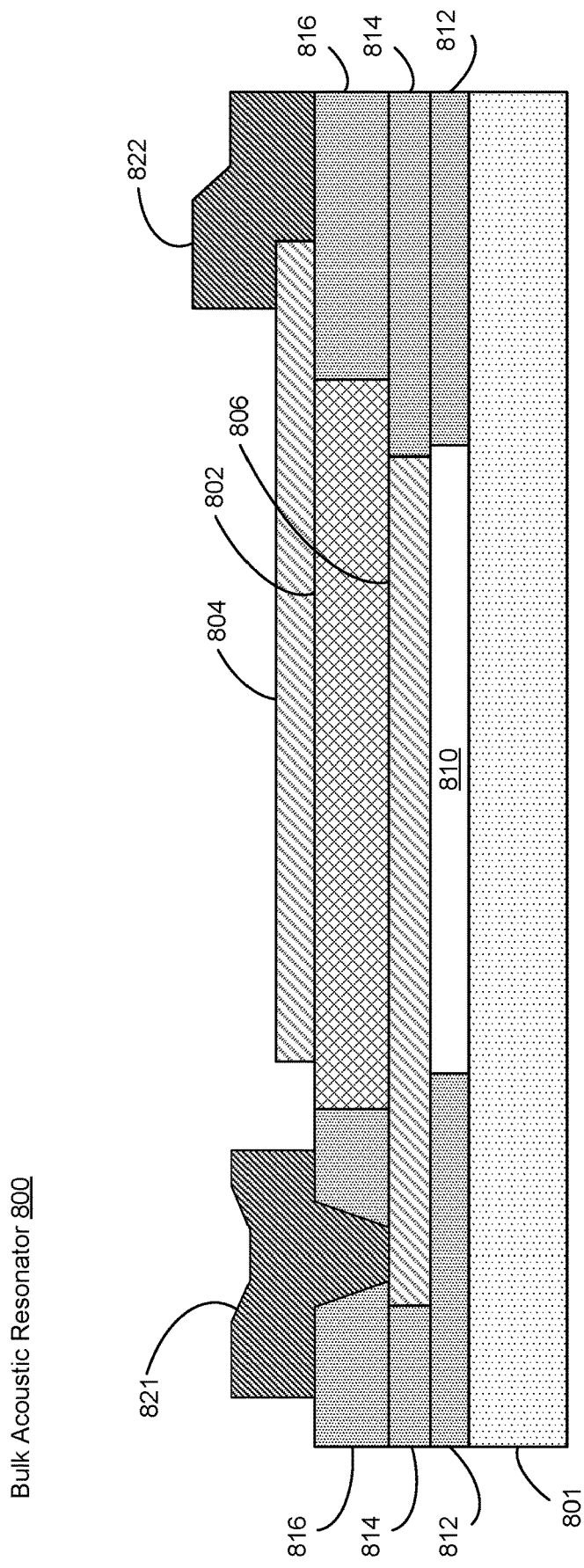

In FIG. 9J, one or more metal contacts 821 electrically coupled to the first electrode 806, and one or more metal contact 822 electrically coupled to the second electrode 804, are formed. Afterwards, cavity 810 is formed by removing sacrificial material 902 (e.g., by vapor HF etching) from beneath bottom electrode 806. Vapor HF etching advantageously reduces the etch time (e.g., compared with liquid HF) and provides a clean surface of the bottom electrode facing the cavity.

Thus, according to some embodiments, in BAW resonator 800, a portion of the layer of piezoelectric material 902 outside of the active resonator is removed and the third planarizing layer 816 of a filler material (e.g., polysilicon) is used to provide third planarized surface 930. This filler material is chosen to have a large difference in acoustic impedance from the acoustic impedance of the piezoelectric material, and thus functions as an "acoustic mirror" to confine the acoustic energy within the active BAW resonator 800.

Figure 9K:
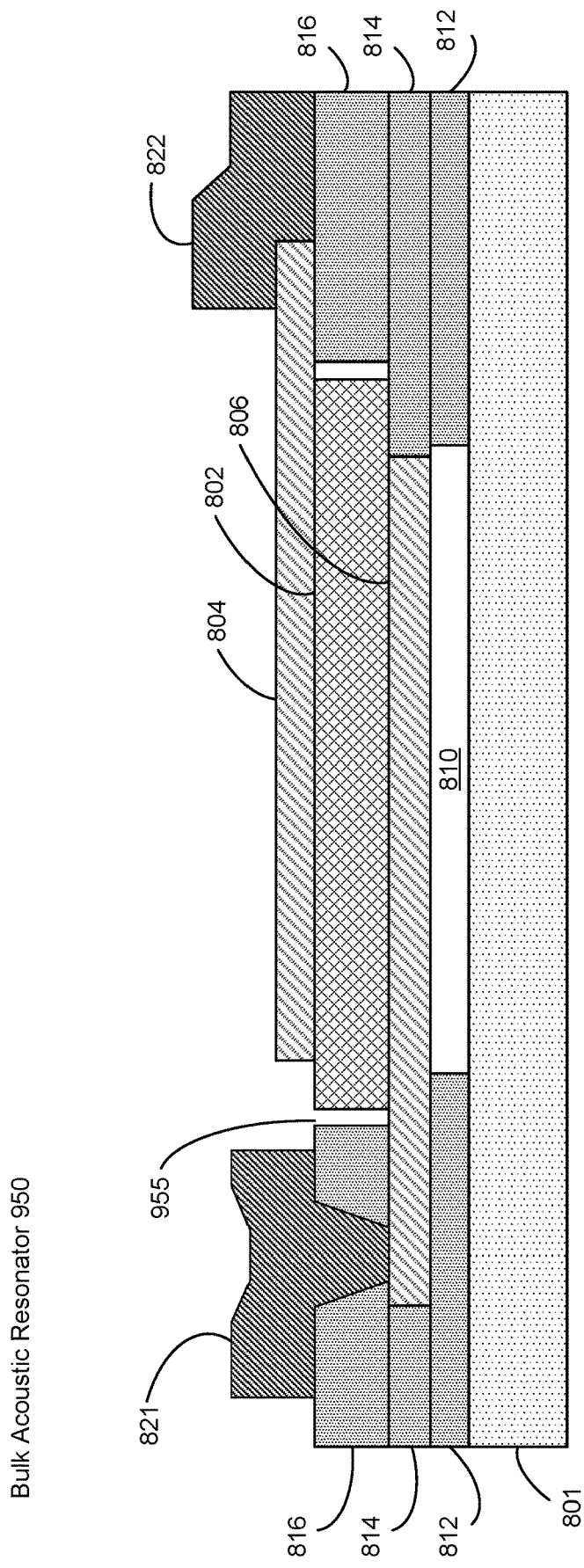
FIG. 9K is a cross-sectional diagram of a bulk acoustic resonator having an air reflector around a piezoelectric film element around a piezoelectric film element, in accordance with some embodiments.

FIG. 9K is a cross-sectional diagram of a BAW resonator 950 according to some embodiments. As shown in FIG. 9K, BAW resonator 950 corresponds to BAW resonator 800 except that an inner portion of third planarizing layer 816 adjacent the piezoelectric film element 802, and/or an outer portion of piezoelectric film element 802 adjacent third planarizing layer 816, is removed to form an air reflector 955 around the piezoelectric film element 802. Air reflector 955 functions to eliminate or further reduce leakage of acoustic energy across edges of piezoelectric film element 802.

Figure 9L:
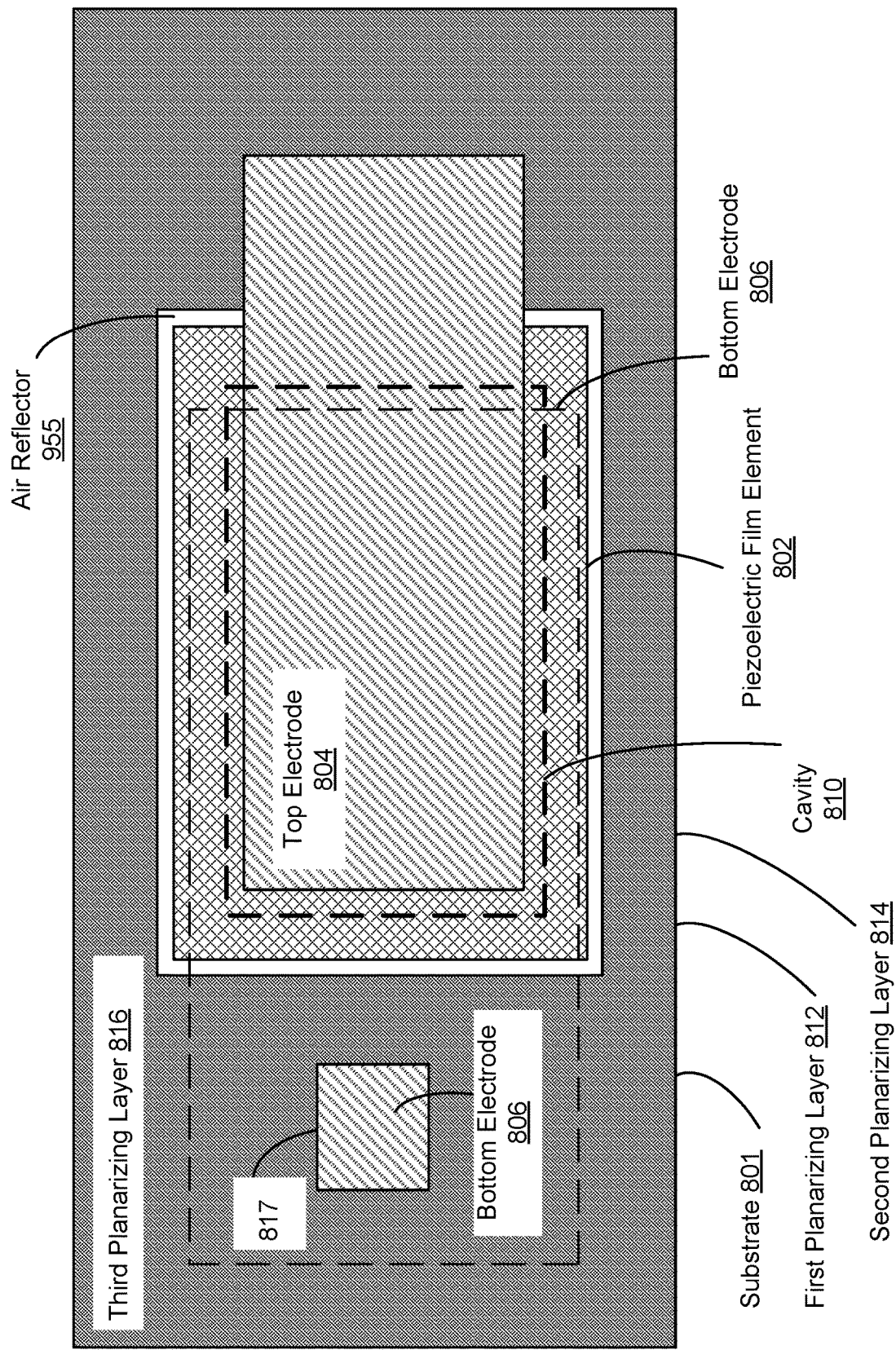
FIG. 9L is a layout view that illustrates various layers of a bulk acoustic resonator having an air reflector around a piezoelectric film element around a piezoelectric film element, in accordance with some embodiments.

FIG. 9L is a plan view illustrating BAW resonator 950 having air reflector 955 around piezoelectric film element 802.

FIGS. 9M-9N illustrate cross-sectional views of various layers of bulk acoustic resonator 950 during formation of air reflector, in accordance with some embodiments.

In FIG. 9M, after formation of third planarizing layer 816, as illustrate in FIG. 9G, and before formation of top electrode 804, as illustrated in FIG. 9H, an inner portion of third planarizing layer 816 adjacent the piezoelectric film element 802, or an outer portion of piezoelectric film element 802 adjacent third planarizing layer 816, is removed using, for example, an anisotropic etching process, resulting in a gap 951 between piezoelectric film element 802, or a remaining portion thereof, and third planarizing layer 816, or a remaining portion thereof.

In FIG. 9N, the gap 951 is filled with a sacrificial material 952 (e.g., the same sacrificial material 902 used to fill the space of the cavity 810) by, for example, chemical vapor deposition of the sacrificial material over the piezoelectric film element 802 and the third planarizing layer 816, followed by chemical mechanical polishing to remove the sacrificial material on top of the piezoelectric film element 802 and the third planarizing layer 816, leaving the gap 951 filled with the sacrificial material 952. The piezoelectric film element 802, the third planarizing layer 816, and the sacrificial material 952 together then provide third planarized surface 930, over which top electrode 804 is formed, as shown in FIG. 9H. Afterwards, contacts 821, 822 can be formed, as illustrated in FIGS. 9I-9J, and sacrificial material 952 can be removed in the same process in which sacrificial material 902 is removed, resulting in the air reflector 955 around piezoelectric film element 802, as shown in FIGS. 9O-9P.

Figure 9O:
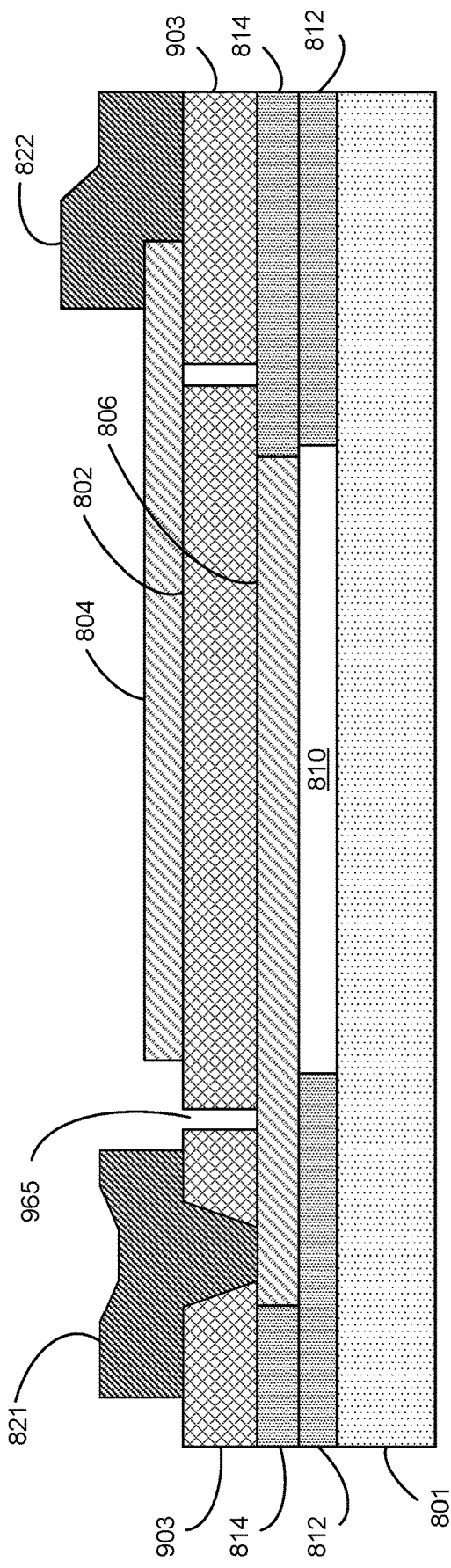
FIG. 9O is a cross-sectional diagram of a bulk acoustic resonator having an air reflector around a piezoelectric film element, in accordance with some embodiments.

FIG. 9O is a cross-sectional diagram of a BAW resonator 960 according to some embodiments. As shown in FIG. 9O, BAW resonator 960 corresponds to BAW resonator 950 except that BAW resonator 960 does not include third planarizing layer 816, and that an air reflector 965 is formed in a blanket piezoelectric film layer, breaking the blanket piezoelectric film layer into a piezoelectric film element 802 in the middle and a piezoelectric filler 903 surrounding the piezoelectric film element 802. Again, air reflector 965 functions to eliminate or further reduce leakage of acoustic energy across edges of piezoelectric film element 802.

Figure 9P:
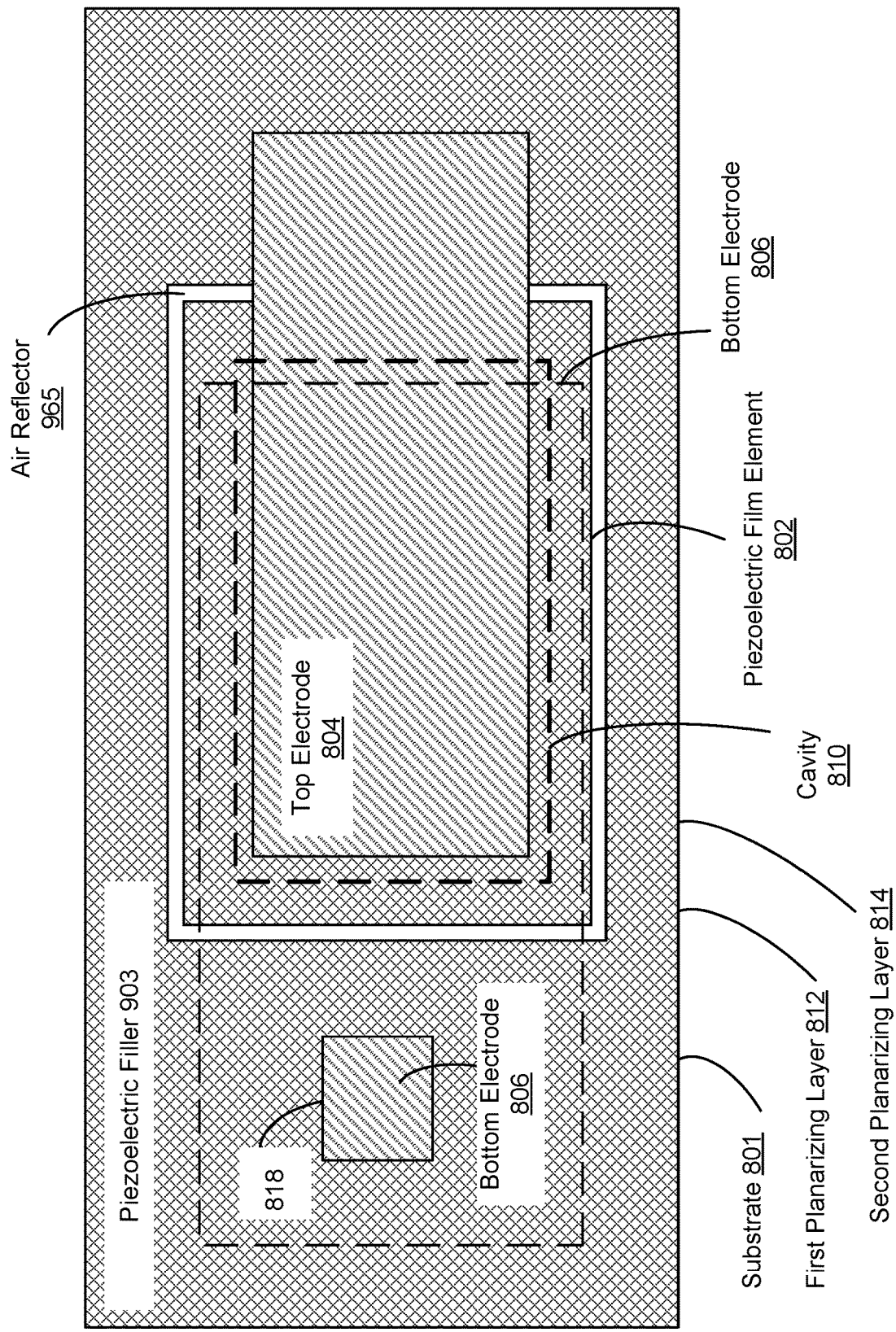
FIG. 9P is a layout view that illustrates various layers of a bulk acoustic resonator having an air reflector around a piezoelectric film element around a piezoelectric film element, in accordance with some embodiments.

FIG. 9P is a plan view illustrating BAW resonator 960 having air reflector 965 around piezoelectric film element 802 and separating the piezoelectric film element 802 from the piezoelectric filler 903 surrounding the piezoelectric film element 802.

Figure 9Q:
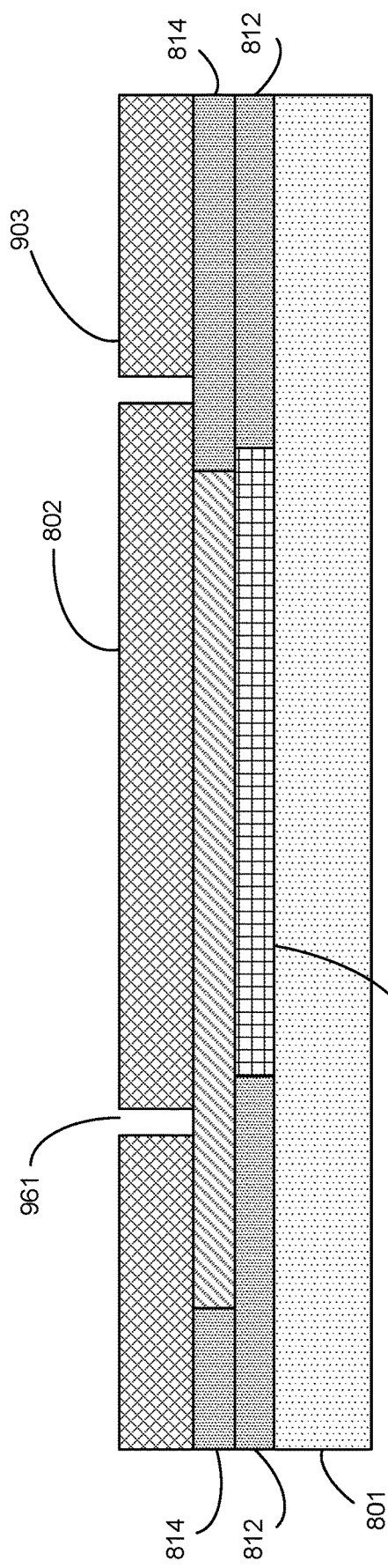
FIGS. 9Q-9R illustrate an approach for fabricating a bulk acoustic resonator including forming one or more planarizing layers and an air reflector around a piezoelectric film element, in accordance with some embodiments.
Figure 9R:
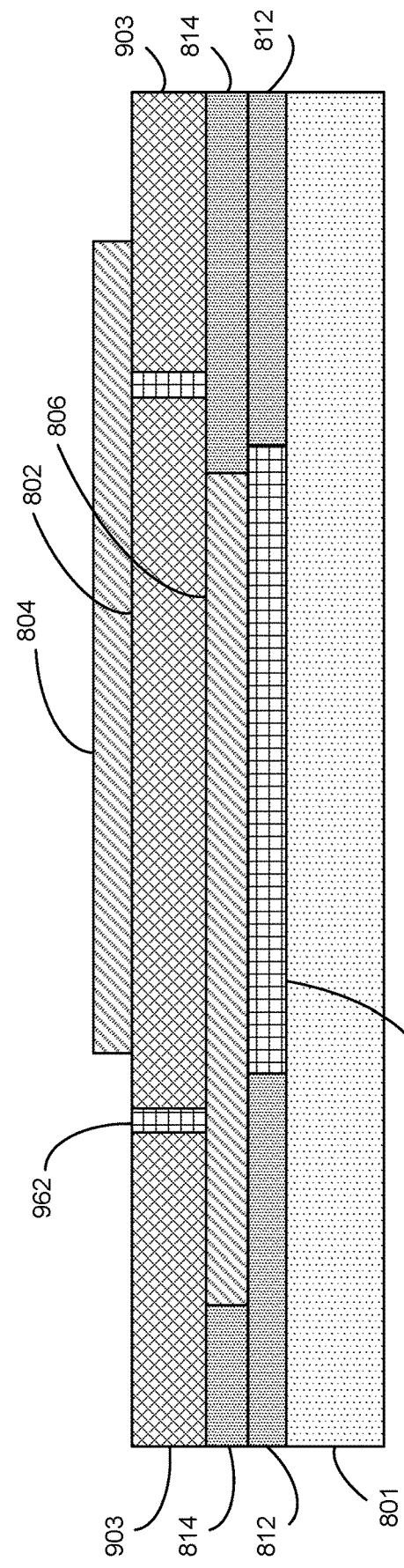

FIGS. 9Q-9R illustrate cross-sectional views of various layers of bulk acoustic resonator 960 during formation of air reflector 965, in accordance with some embodiments.

In FIG. 9Q, after formation of the layer of piezoelectric material 902, as illustrate in FIG. 9E, a gap 961 is etched into the layer of piezoelectric material 902 using, for example, an anisotropic etching process, separating a middle portion of the layer of piezoelectric material 902, which becomes the piezoelectric film element 802, and an outer portion of the layer of piezoelectric material 902, which becomes the piezoelectric filler 903.

In FIG. 9R, the gap 961 is filled with a sacrificial material 962 (e.g., the same sacrificial material 902 used to fill the space of the cavity 810). Afterwards, top electrode 804 and contacts 821, 822 can be formed, as illustrated in FIGS. 9H-9J, and sacrificial material 962 can be removed in the same process in which sacrificial material 902 is removed, resulting in the air reflector 965 around piezoelectric film element 802.

FIGS. 10A-10D illustrates a process 1000 for forming a BAW resonator including one or more planarizing layers according to some embodiments. Process 1000 for involves, e.g., deposition, oxidation, lithography patterning, etch, lift-off, and/or chemical mechanical planarization processes, in appropriate sequences, as described below. While these sequences of operations, and the resulting bulk acoustic resonators, are new, the techniques needed to perform each of the individual steps or operations of these processes are well understood in the art, and therefore the individual processing steps or operations are not described in detail. The dotted lines in process 1000 illustrate optional operations.

Figure 10A:
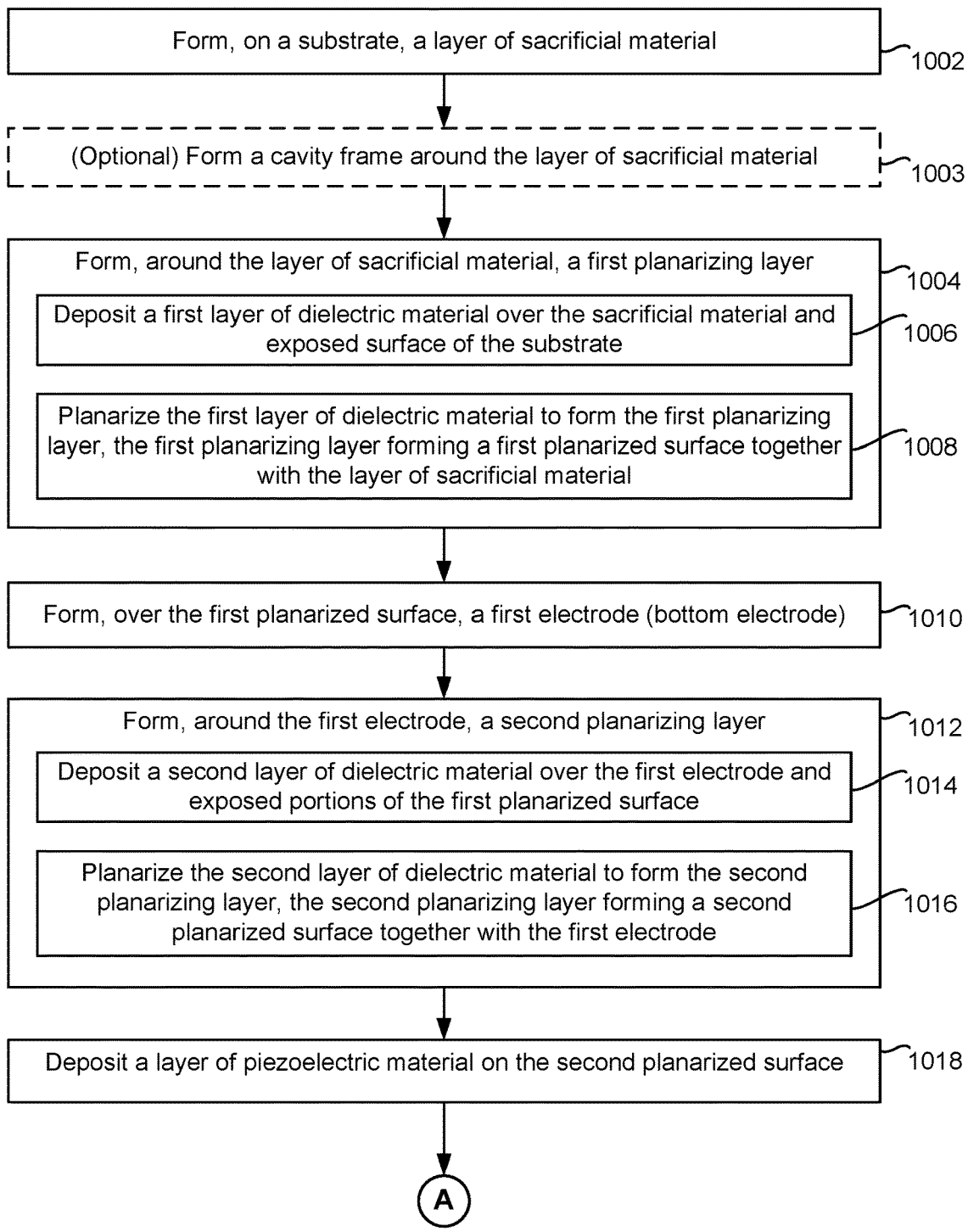
FIGS. 10A-10D illustrate a flowchart representation of a process for forming a bulk acoustic resonator, in accordance with some embodiments.

As shown in FIG. 10A, process 1000 includes forming (1002), on a substrate 801, a layer of sacrificial material 902 (e.g., as described with regard to FIG. 9A) or 602 (as described with regard to FIG. 6A), and may optionally include forming (1003) a cavity frame 108 in a perimeter around the sacrificial material 602 (e.g., as described with regard to FIG. 6B).

Process 1000 further includes forming (1004), around the layer of sacrificial material 902 a first planarizing layer 812 (e.g., as described with regard to FIG. 9B). In some embodiments, forming (1004) includes depositing (1006) a first layer of dielectric material (e.g., polysilicon) over the sacrificial material 902 and exposed surface of the substrate 801, and planarizing (1008) the first layer of dielectric material to form the first planarizing layer 812. The first planarizing layer 812 thus formed provides a first planarized surface 910 together with the layer of sacrificial material 902 (e.g., as described with regard to FIG. 9B).

Process 1000 further includes forming (1010) a first electrode (bottom electrode 806) over the first planarized surface 910 (e.g., as described with regard to FIG. 9C).

Process 1000 further includes forming (1012), around the first electrode 806, a second planarizing layer 814 (e.g., as described with regard to FIG. 9D). In some embodiments, forming (1012) includes depositing (1014) a second layer of dielectric material (e.g., polysilicon) over the bottom electrode 806 and exposed portions of first planarized surface 910, and planarizing (1016) the second layer of dielectric material to form the second planarizing layer 814. The second planarizing layer 814 thus formed provides a second planarized surface 920 together with the bottom electrode 806 2 (e.g., as described with regard to FIG. 9D).

Process 1000 further includes depositing (1018) a layer of piezoelectric material 902 on the second planarized surface 920 (e.g., as described with regard to FIG. 9E).

Figure 10B:
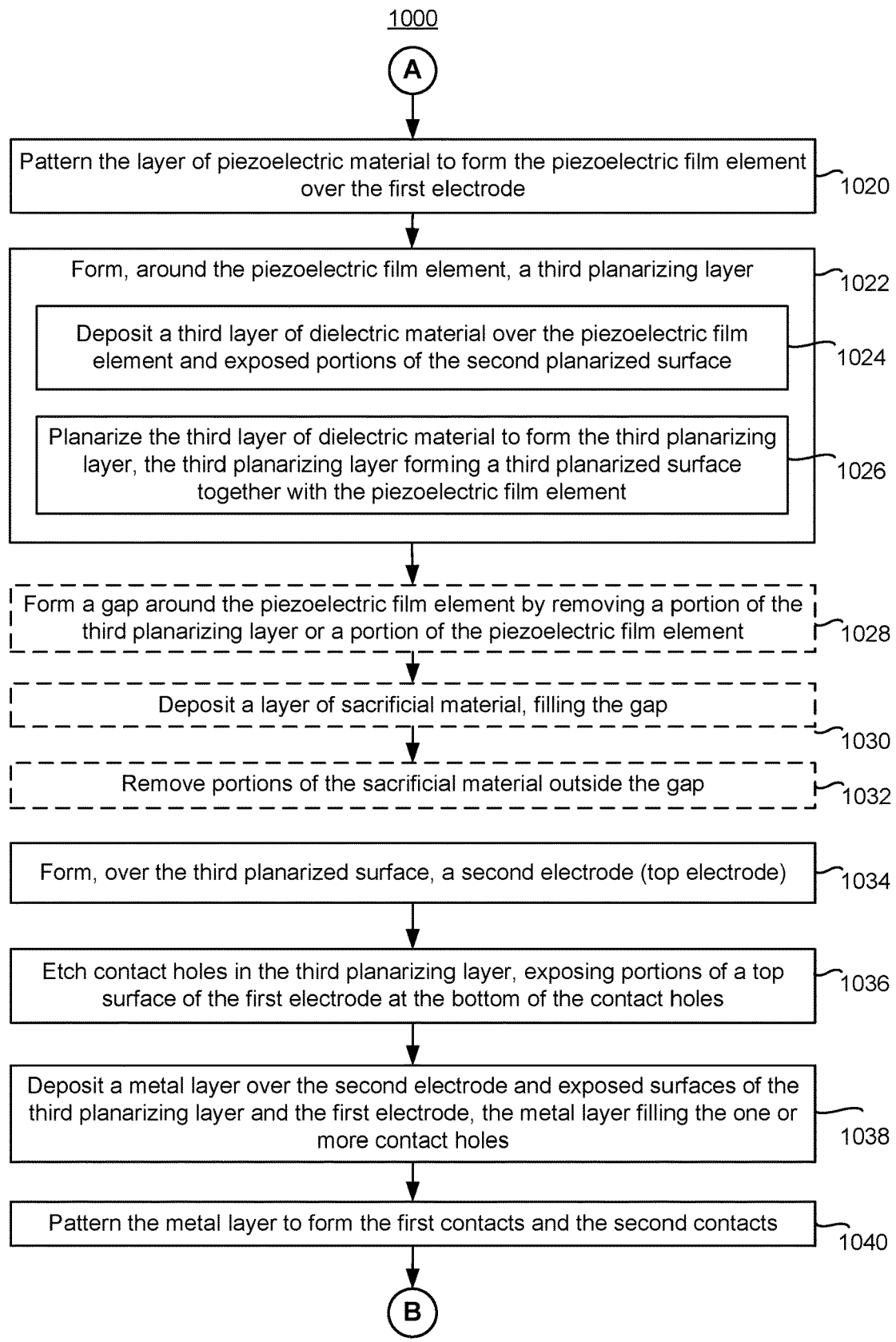

As shown in FIG. 10B, to form BAW resonator 800 or BAW resonator 950, process 1000 further includes patterning (1020) the layer of piezoelectric material 902 to remove an outer portion of the layer of piezoelectric material 902, whereby a remaining portion of the layer of piezoelectric material 902 becomes piezoelectric film element 802 over bottom electrode 806, and forming (1022), around piezoelectric film element 802, a third planarizing layer 816 (e.g., as described with regard to FIG. 9G). In some embodiments, forming (1022) includes depositing (1024) a third layer of dielectric material over piezoelectric film element 802 and exposed portions of the second planarized surface 920, and planarizing the third layer of dielectric material to form third planarizing layer 816. The third planarizing layer 816 thus formed provide a third planarized surface 930 together with piezoelectric film element 802 (e.g., as described with regard to FIG. 9G).

As shown in FIG. 10B, optionally, to form the air reflector 955 in BAW resonator 950, process 1000 may further include forming (1028) a gap 951 around the piezoelectric film element by removing an inner portion of the third planarizing layer or an outer portion of the piezoelectric film element (e.g., as described with regard to FIG. 9M), depositing (1030) a layer of sacrificial material over the third planarized surface 930 filling the gap 951, and removing (1032) portions of the sacrificial material outside the gap, for example, chemical mechanical polishing, leaving a sacrificial filler 952 occupying the gap 951 (e.g., as described with regard to FIG. 9N).

Process 1000 further includes forming (1034) a second electrode (top electrode 804) over the piezoelectric film element 802 (e.g., as described with regard to FIG. 9H), forming (1036) contact holes 817 in third planarizing layer 816 to expose a portion of bottom electrode 806 at the bottom of each contact hole 817 (e.g., as described with regard to FIG. 9I), depositing (1038) (e.g., by physical vapor deposition) a metal layer over the second electrode 804 and exposed surfaces of the third planarizing layer 816 and the first electrode 806, the metal layer filling the one or more contact holes 817, and patterning (1040) (e.g., by anisotropic etching) the metal layer to form the first contacts 821 and the second contacts 822 (e.g., as described with regard to FIG. 9J).

Figure 10C:
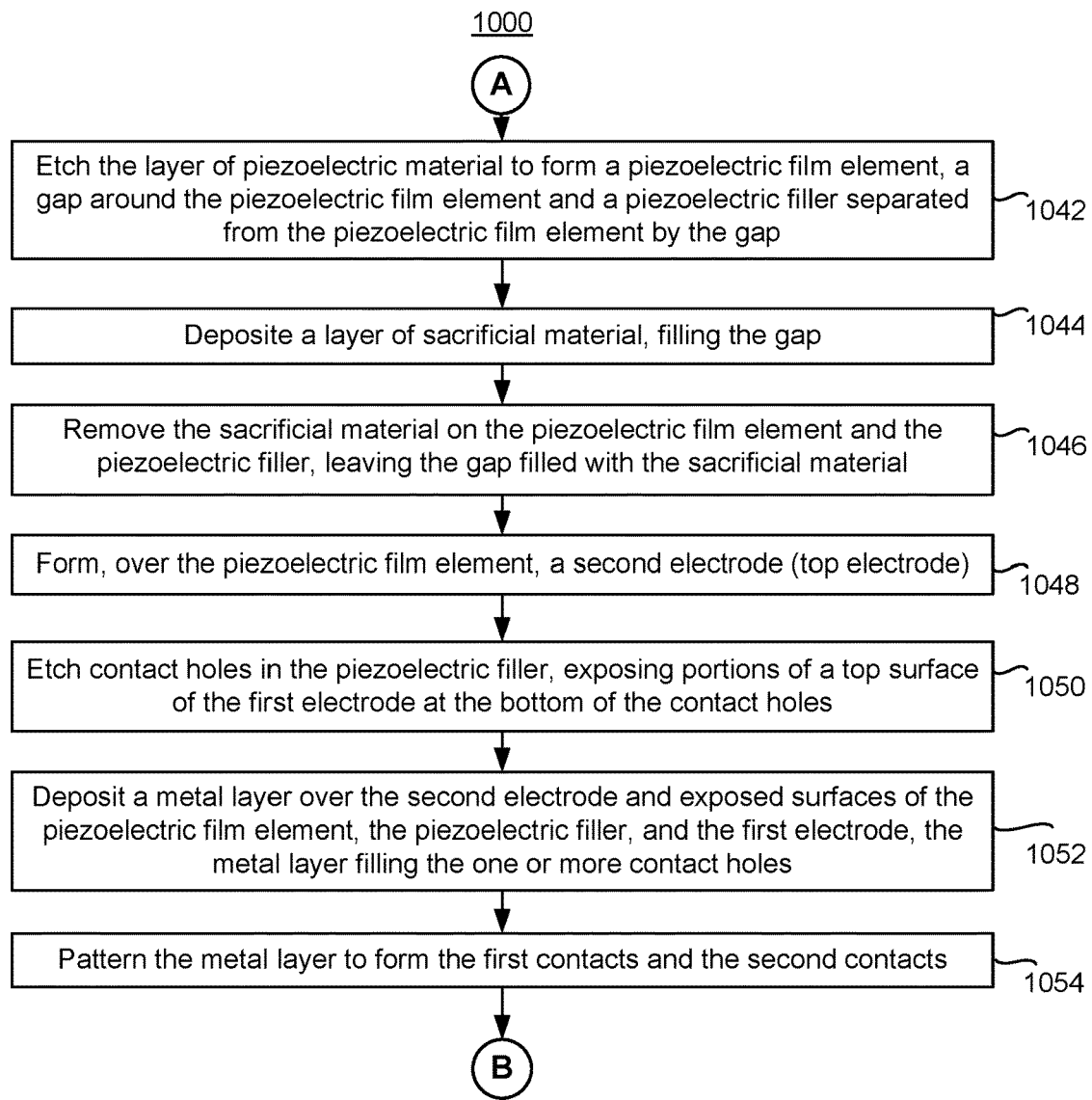

As shown in FIG. 10C, to form BAW resonator 960, process 1000 further includes, after depositing (1018) the layer of piezoelectric material 902 on the second planarized surface 920, instead of removing an outer portion of the layer of piezoelectric material 902, etching (1042) the layer of piezoelectric material 902 to form a piezoelectric film element 802 and a gap 961 around the piezoelectric film element 802. The gap 961 separates piezoelectric film element 802 from a piezoelectric filler 903 made of an outer portion of the layer of piezoelectric material 902 (e.g., as described with regard to FIG. 9Q). The piezoelectric filler 903 functions as a third planarizing layer for BAW resonator 960, similarly as the third planarizing layer 816 in BAW resonator 950. Process 1000 further includes depositing (1044) a layer of sacrificial material over the layer of piezoelectric material 902 filling the gap 961, and removing (1032) portions of the sacrificial material outside the gap using, for example, chemical mechanical polishing, leaving a sacrificial filler 962 occupying the gap 961 (e.g., as described with regard to FIGS. 9Q and 9R) in the third planarizing layer 816.

Process 1000 further includes forming (1048) a second electrode (top electrode 804) over the piezoelectric film element 802 (e.g., as described with regard to FIG. 9R), forming (1050) contact holes 817 in the piezoelectric filler 903 to expose a portion of bottom electrode 806 at the bottom of each contact hole 817, depositing (1052) (e.g., by physical vapor deposition) a metal layer over the second electrode 804 and exposed surfaces of the piezoelectric film element, the piezoelectric filler 903 and the first electrode 806, the metal layer filling the one or more contact holes 817, and patterning (1054) (e.g., by anisotropic etching) the metal layer to form the first contacts 821 and the second contacts 822 (e.g., as described with regard to FIG. 9O).

Figure 10D:
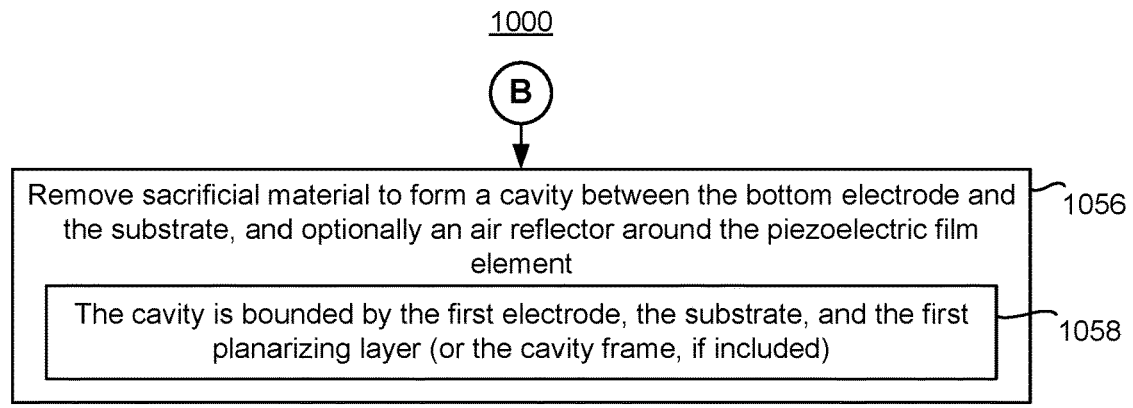

As shown in FIG. 10D, to form any of BAW resonators 800, 950 and 960, process 1000 further includes removing (1056) sacrificial material(s) to form cavity 810 (for BAW resonators 800, 950) and 960) and air reflector 955 (for BAW resonator 950) or air reflector 965 (for BAW resonator 960).

At least a portion of the sacrificial material 902 is removed (1056) to form cavity 810 (e.g., as described with regard to FIG. 9J). In some embodiments, The cavity 810 thus formed is bounded by the first electrode 806, the substrate 801, and the first planarizing layer 812 or cavity frame 108 if provided (e.g., as illustrated by FIGS. 8A-8E, 9J, 9K-9L and 9O-9P).

At least a portion of the sacrificial fillers 952 or 962 is removed (1056) to form air reflector 955 or 965, respectively (e.g., as described with regard to FIG. 9K or FIG. 9O).

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A bulk acoustic resonator, comprising:
 a stack formed over a substrate, the stack including:
  a piezoelectric film element;
  a first electrode coupled to a first side of the piezoelectric film element; and
  a second electrode coupled to a second side of the piezoelectric film element;
 a cavity between the stack and the substrate;
 a first planarizing layer around the cavity, wherein a first portion of the first electrode is adjacent the cavity and a second portion of the first electrode is adjacent the first planarizing layer;
 a second planarizing layer around the first electrode, wherein the second planarizing layer and the first electrode together provide a second planarized surface over which the piezoelectric film element is formed; and
 a third planarizing layer around the piezoelectric film element, wherein the third planarizing layer and the piezoelectric film element together provide a third planarized surface over which the second electrode is formed, wherein a first portion of the third planarizing layer is adjacent the first electrode but not the second electrode and a second portion of the third planarizing layer is adjacent the second electrode but not the first electrode,
wherein the stack is configured to resonate in response to an electrical signal applied between the first electrode and the second electrode.

2. The bulk acoustic resonator of claim 1, wherein:
the first electrode is formed on a first planarized surface provided by the first planarizing layer together with a sacrificial layer; and
the cavity is formed by removing the sacrificial layer after the stack is formed, the cavity being bounded by the first electrode, the substrate, and the first planarizing layer.

3. The bulk acoustic resonator of claim 1, wherein the first planarizing layer includes polysilicon.

4. The bulk acoustic resonator of claim 1, further comprising an air reflector around the piezoelectric film element.

5. The bulk acoustic resonator of claim 1, wherein the second planarizing layer includes polysilicon.

6. The bulk acoustic resonator of claim 1, further comprising a contact hole through the first portion of the third planarizing layer and a metal contact filling the contact hole and electrically coupled to the first electrode.

7. A bulk acoustic resonator, comprising:
a stack formed over a substrate, the stack including:
  a piezoelectric film element;
  a first electrode coupled to a first side of the piezoelectric film element; and
  a second electrode coupled to a second side of the piezoelectric film element;
a cavity between the stack and the substrate;
a first planarizing layer around the cavity, wherein a first portion of the first electrode is adjacent the cavity and a second portion of the first electrode is adjacent the first planarizing layer;
a second planarizing layer around the first electrode, wherein the second planarizing layer and the first electrode together provide a second planarized surface over which the piezoelectric film element is formed;
a third planarizing layer around the piezoelectric film element, wherein the third planarizing layer and the piezoelectric film element together provide a third planarized surface over which the second electrode is formed; and
an air reflector between at least a portion of the third planarizing layer and the piezoelectric film element,
wherein the stack is configured to resonate in response to an electrical signal applied between the first electrode and the second electrode.

8. The bulk acoustic resonator of claim 7, wherein:
the first electrode is formed on a first planarized surface provided by the first planarizing layer together with a sacrificial layer; and
the cavity is formed by removing the sacrificial layer after the stack is formed, the cavity being bounded by the first electrode, the substrate, and the first planarizing layer.

9. The bulk acoustic resonator of claim 7, wherein the first planarizing layer includes polysilicon.

10. The bulk acoustic resonator of claim 7, wherein the second planarizing layer includes polysilicon.

* * * * *